(12) United States Patent
Greer et al.

(10) Patent No.: US 11,864,472 B2
(45) Date of Patent: Jan. 2, 2024

(54) METHODS AND SYSTEMS FOR ATOMIC LAYER ETCHING AND ATOMIC LAYER DEPOSITION

(71) Applicant: California Institute of Technology, Pasadena, CA (US)

(72) Inventors: Harold Frank Greer, Pasadena, CA (US); Andrew D. Beyer, Pasadena, CA (US); Matthew D. Shaw, Pasadena, CA (US); Daniel P. Cunnane, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 54 days.

(21) Appl. No.: 17/373,619

(22) Filed: Jul. 12, 2021

(65) Prior Publication Data

US 2022/0013706 A1 Jan. 13, 2022

Related U.S. Application Data

(60) Provisional application No. 63/050,617, filed on Jul. 10, 2020.

(51) Int. Cl.
*H10N 60/01* (2023.01)
*H10N 60/83* (2023.01)

(52) U.S. Cl.
CPC .............. *H10N 60/01* (2023.02); *H10N 60/83* (2023.02)

(58) Field of Classification Search
CPC .... H10N 60/01; H10N 60/83; H10N 60/0856; C23C 14/0026; C23C 14/067; C23C 16/38; C23C 16/45525; H01L 21/3065; H01L 21/31055; H01L 21/6719; H01L 21/67248; H01L 21/31116
See application file for complete search history.

(56) References Cited

U.S. PATENT DOCUMENTS

| | | | |
|---|---|---|---|
| 2001/0004066 A1 | 6/2001 | Toshima et al. | |
| 2010/0221894 A1* | 9/2010 | Lee ...................... | B82Y 30/00 257/E21.09 |
| 2011/0139748 A1 | 6/2011 | Donnelly et al. | |
| 2017/0243755 A1 | 8/2017 | Tapily | |

(Continued)

OTHER PUBLICATIONS

George et al. ("Prospects for Thermal Atomic Layer Etching using Sequential, Self-Limiting Fluorination and Ligand-Exchange Reactions," ACS Nano, 10, pp. 4889-4894, 2016) (Year: 2016).*

(Continued)

*Primary Examiner* — Yasser A Abdelaziez
(74) *Attorney, Agent, or Firm* — Gates & Cooper LLP

(57) ABSTRACT

A method for etching a surface including obtaining a structure comprising a plurality of nanowires on or above a substrate and a dielectric layer on or above the nanowires, wherein the dielectric layer comprises protrusions formed by the underlying nanowires; reacting a surface of the dielectric layer with a reactant, comprising a gas or a plasma, to form a reactive layer on the dielectric layer, wherein the reactive layer comprises a chemical compound including the reactant and elements of the dielectric layer and the reactive layer comprises sidewalls defined by the protrusions; and selectively etching the reactive layer, wherein the etching etches the protrusions laterally through the sidewalls so as to planarize the surface and remove or shrink the protrusions.

20 Claims, 22 Drawing Sheets

(56) References Cited

U.S. PATENT DOCUMENTS

| | | |
|---|---|---|
| 2019/0120571 A1* | 4/2019 | Ziade .................. H01L 21/4871 |
| 2019/0131130 A1* | 5/2019 | Smith ..................... C23C 16/52 |
| 2020/0027746 A1 | 1/2020 | Vervuurt et al. |
| 2020/0161148 A1 | 5/2020 | Abel |
| 2021/0313185 A1 | 10/2021 | Greer |
| 2022/0136104 A1 | 5/2022 | Pasquale et al. |

OTHER PUBLICATIONS

Li et al. ("A Novel Dry Selective Isotropic Atomic Layer Etching of SiGe for Manufacturing Vertical Nanowire Array with Diameter Less that 20 nm," Materials, 13, 771, pp. 1-11, 2020) (Year: 202).*

* cited by examiner

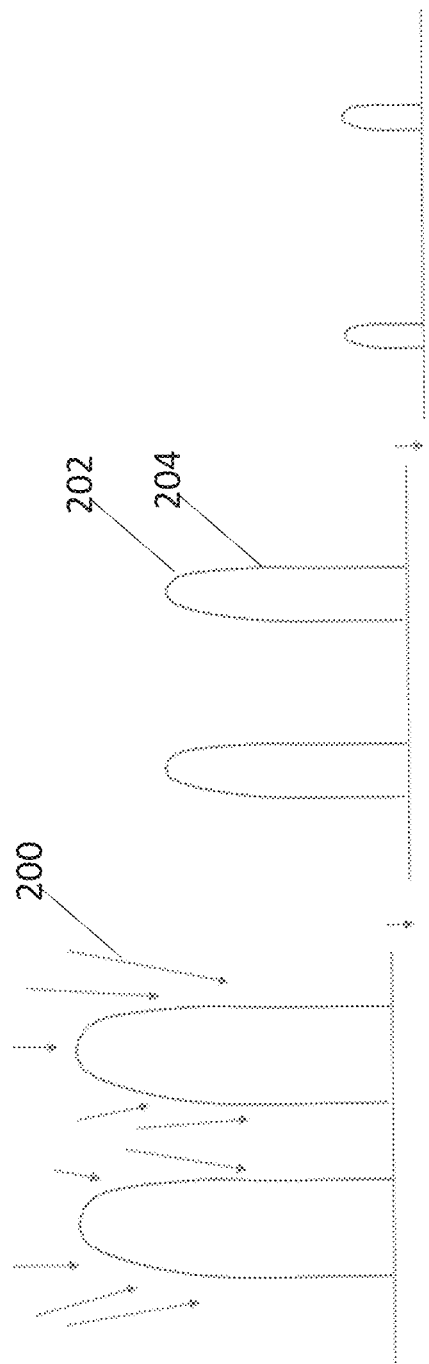

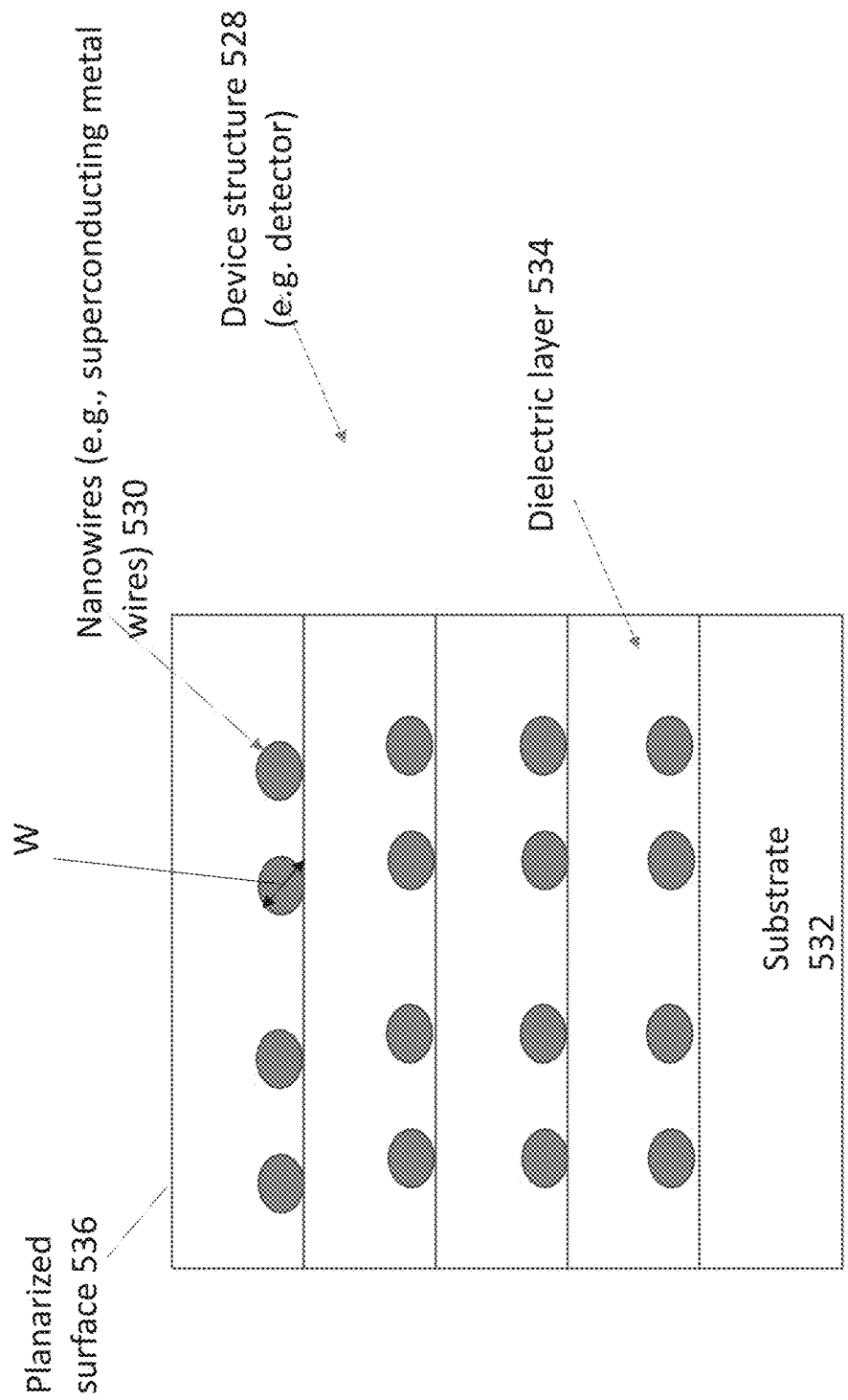

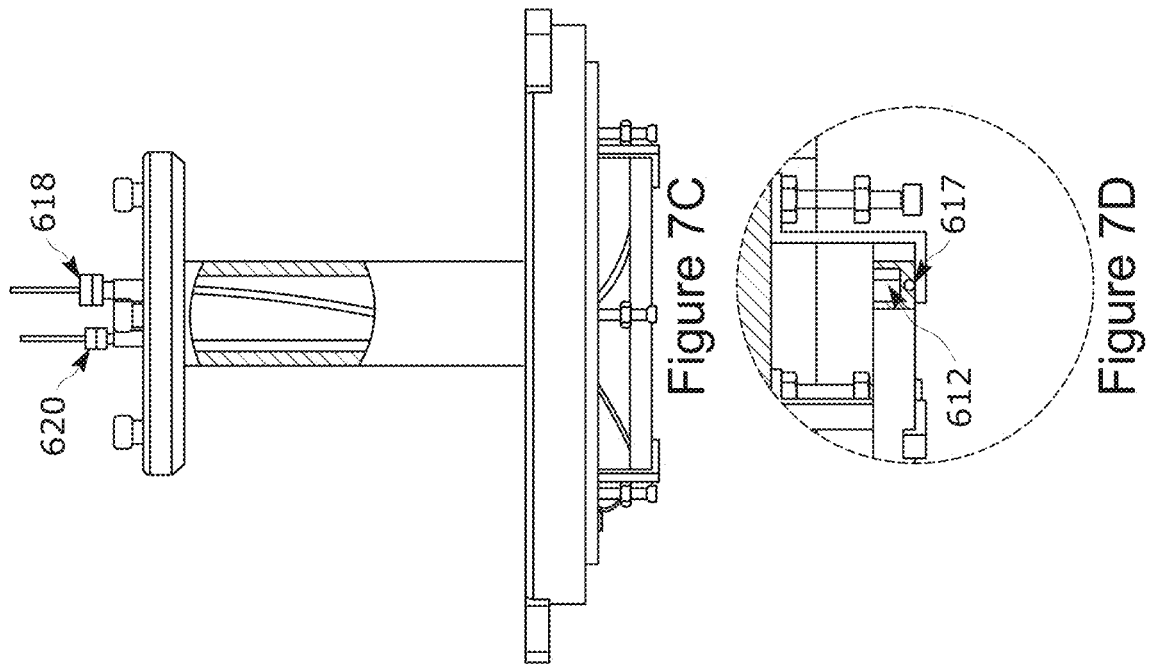
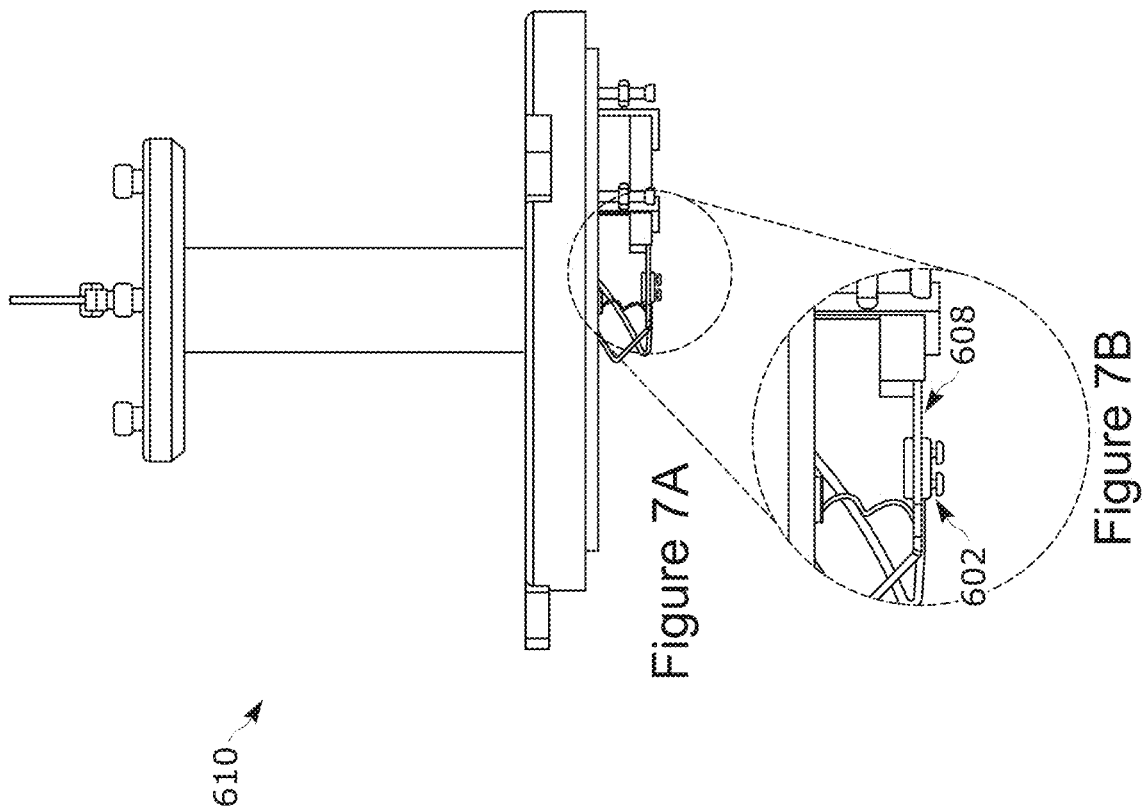

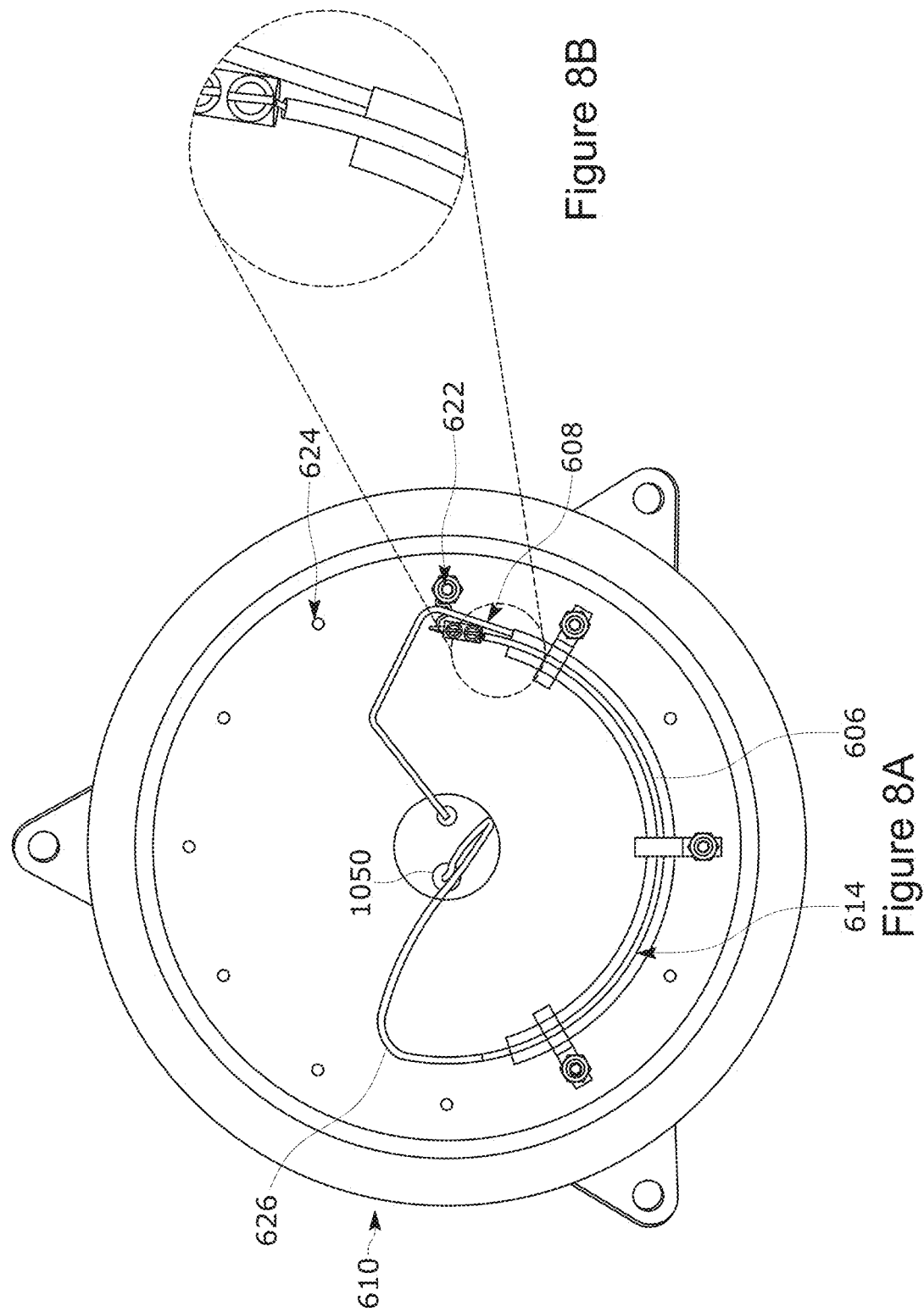

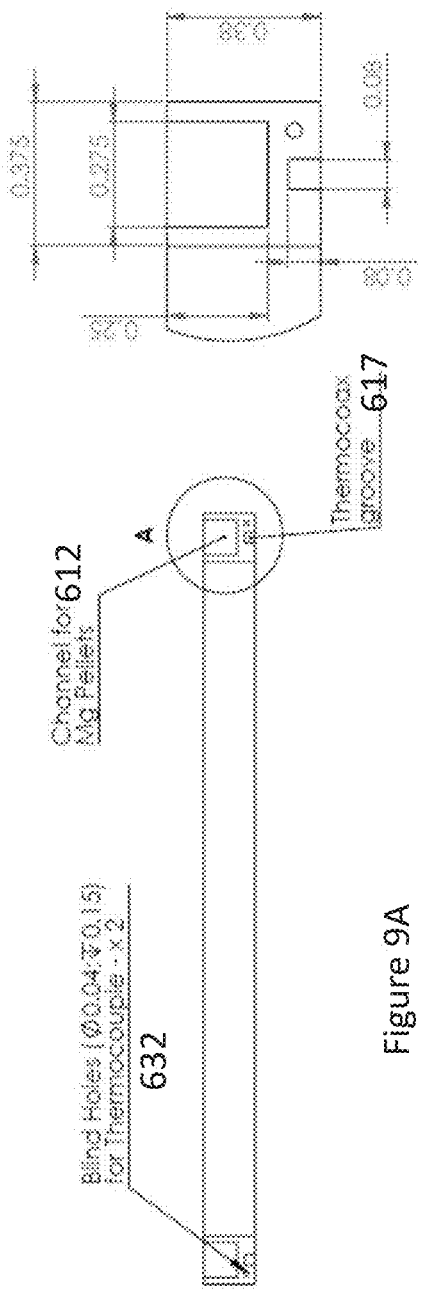
Figure 9B
Figure 9A
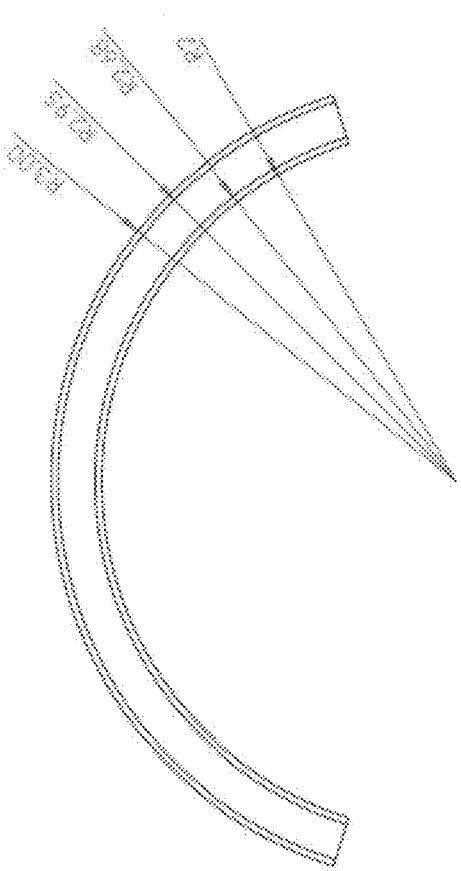
Figure 9C

METHODS AND SYSTEMS FOR ATOMIC LAYER ETCHING AND ATOMIC LAYER DEPOSITION

CROSS REFERENCE TO RELATED APPLICATIONS

This application claims the benefit under 35 USC 119(e) of commonly assigned U.S. Provisional Patent Application Ser. No. 63/050,617, filed Jul. 10, 2020, by Harold Frank Greer, Rehan Kapadia, Debargyha Sarkar, Daniel P. Cunnane, Andrew D. Beyer, and Matthew D. Shaw, entitled "EPI SUBSTRATE SURFACES FOR III-V MATERIAL GROWTH USING ATOMIC LAYER ETCHING AND IMPROVED III-V SURFACES FOR HIGHER CHANNEL MOBILITY," which application is incorporated by reference herein.

STATEMENT REGARDING FEDERALLY SPONSORED RESEARCH AND DEVELOPMENT

This invention was made with government support under Grant No. 80NMO0018D0004 awarded by NASA (JPL). The government has certain rights in the invention.

BACKGROUND OF THE INVENTION

1. Field of the Invention

The present invention relates to methods and systems for etching and atomic layer deposition.

2. Description of the Related Art

Devices and elements in semiconductor, display, and optical systems are continuously shrinking in size and increasing in complexity. The assembly of these devices into their final form is also particularly complicated. For either or both of these reasons, the smoothness of the interfaces and surfaces of these components are particularly important. Thus, there is a need to control and minimize the roughness of materials within devices and elements in semiconductor, display, and optical devices for optical, mechanical, and assembly reasons. The present disclosure satisfies this need.

Superconducting devices, detectors, and circuits often involve multiple layers of extremely thin metal wires (<10 nm thick), separated by dielectric layers that provide electrical isolation. As more and more layers are added, because subsequent wires are hard to keep connected as they must pass over the stacked layers of topology. Conventional processing can be used in semiconductor processing to counter topology through chemical mechanical polishing (CMP). CMP planarizes surfaces through the mechanical removal of material, selectively removing high spots on the surface of interest. However, CMP can leave damaged layers (which can lead to undesirable degradation of superconducting wires, and it can be difficult to control to the level of precision required for stacked layers of these thicknesses.

SUMMARY OF THE INVENTION

Illustrative, non-exclusive examples of inventive subject matter according to the present disclosure are described in the following enumerated paragraphs.

1. A method for etching a surface, comprising:

(a) obtaining a structure comprising a plurality of nanowires on or above a substrate and a dielectric layer on or above the nanowires, wherein the dielectric layer comprises protrusions formed by the underlying nanowires;

(b) reacting a surface of the dielectric layer with a reactant, comprising a gas or a plasma, to form a reactive layer on the dielectric layer, wherein the reactive layer comprises a chemical compound including the reactant and elements of the dielectric layer and the reactive layer comprises sidewalls defined by the protrusions; and (c) selectively etching the reactive layer, wherein the etching etches the protrusions laterally through the sidewalls so as to planarize the surface and remove or shrink the protrusions.

2. The method of paragraph 1, wherein the etching comprises reacting the reactive layer with an agent that induces a re-arrangement of chemical bonds between constituents of the reactive layer and wherein the re-arrangement removes the reactive layer from the surface.

3. The method of paragraph 2, wherein the reacting comprises projecting the agent onto the surface with an energy:

below that required for physical sputtering of the surface using the agent so that the material is not ejected from the substrate by a physical sputtering process, and sufficient to act as a catalyst for the re-arrangement.

4. The method of paragraph 2, wherein the agent comprises ions.

5. The method of paragraph 1, wherein the etching comprises accelerating ions onto the surface so that a majority of the ions impact the surface at an angle of at least 10 degrees with respect to a surface normal.

6. The method wherein the etching comprises accelerating ions onto the reactive layer along a direction having a larger component parallel to the surface of the reactive layer, as compared to the component normal to the surface.

7. The method of paragraph 1, wherein the etching comprises chemical sputtering.

8. The method of paragraph 1, wherein the reactive layer comprises valleys having sidewalls and the etching etches the valleys laterally through the sidewalls so as to planarize the surface and remove or connect the valleys.

9. The method of paragraph 8, wherein the valleys have a height and width in a range of 1-100 nm.

10. The method of paragraph 1, wherein the reactant comprises at least one of a halogen that halogenates the surface, a sulphide so as to form the reactive layer comprising a sulphide, hydrogen or a hydride so as to form the reactive layer comprising a hydride, a nitride or nitrogen so as to form the reactive layer comprising a nitride, or oxygen or an oxide so as to form the reactive layer comprising an oxide.

11. The method of paragraph 1, wherein the structure comprises an electrical circuitry including the nanowires, the method further comprising electrically contacting the nanowires through the dielectric layer with wires or components in different layers of a multilayer device.

12. The method of paragraph 1, wherein the nanowires comprise WSi.

13. The method of paragraph 1, wherein the substrate comprises silicon, the nanowires comprise metal, the dielectric layer comprises silicon dioxide.

14. The method of paragraph 13, wherein the reactive layer comprises chlorinated silicon, the reactant comprises chlorine, and the agent comprises argon ions.

15. The method of paragraph 1, further comprising repeating steps (b) and (c) so as to perform a plurality of etching cycles each comprising the step (b) and the step (c), wherein:
the cycles include a first cycle and a second cycle subsequent to the first cycle,
the second cycle forms the reactive layer that is thinner as compared to the reactive layer formed in the first cycle, so that the etching in the second cycle etches the reactive layer with a finer resolution as compared to the etching in the first cycle.

16. An electrical circuit manufactured using the method of paragraph 1.

17. The method of paragraph 1, wherein the nanowires comprise metal wires having a diameter of 10 nanometers or less.

18. A device structure, comprising:
a plurality of nanowires on or above a substrate, wherein the nanowires each have a width in a range of 1-500 nanometers;
a dielectric layer having a thickness less than 1000 nm on or above the nanowires, wherein the dielectric layer comprises an etched surface having a surface roughness of less than 5 nanometers.

19. The device structure of paragraph 18, wherein the dielectric layer comprises protrusions formed by and aligned with the underlying nanowires and the protrusions have a height and a width less than 5 nanometers.

20. The device of paragraph 18, wherein dielectric layer comprises valleys having laterally etched sidewalls.

21. The device of paragraph 18, further comprising one or more layers including wiring on or above the dielectric layer.

22. The device structure of paragraph 18 manufactured by a process comprising:
(a) obtaining a structure comprising the dielectric layer on or above the nanowires, wherein the dielectric layer comprises protrusions formed by the underlying nanowires;
(b) reacting a surface of the dielectric layer with a reactant, comprising a gas or a plasma, to form a reactive layer on the dielectric layer, the reactive layer comprising a chemical compound including the reactant and the dielectric layer, wherein the reactive layer comprises sidewalls defined by the protrusions; and
(c) selectively etching the reactive layer, wherein the etching etches the protrusions laterally through the sidewalls so as to planarize the surface and remove or shrink the protrusions.

23. An apparatus for etching a substrate, comprising:
one or more reactor tools reacting a reactant with a surface of a dielectric layer so as to form a reactive layer on the dielectric layer, wherein the reactant comprises a gas or plasma, wherein:
the reactive layer comprises a chemical compound including the reactant and elements of the dielectric layer; and
the dielectric layer comprises protrusions formed by the underlying nanowires; and
one or more etching tools selectively etching the protrusions laterally through the sidewalls so as to planarize the surface and remove or shrink the protrusions.

BRIEF DESCRIPTION OF THE DRAWINGS

Referring now to the drawings in which like reference numbers represent corresponding parts throughout.

FIG. 2A-2D. Etch Protrusion Trimming, showing the etch rate is nearly the same in all directions, so that even though the substrate is also etched, the protrusions are trimmed in all directions and consequently shrink faster than the rate of etching of the flat surface FIG. 2C shows the protrusions trimmed or shrunk due to the etching as compared to in FIGS. 2A and FIG. 2B). FIG. 2D illustrates etching of the reactive layer.

FIG. 3A-3B illustrate nano-planarization of buried nanowires using Atomic Layer Etch, showing a 3D view of an oxide surface with buried nanowires, wherein FIG. 3A shows before Atomic Layer Etch and FIG. 3B shows after Atomic Layer Etch, indicating a peak to valley for wires reduced from 50 nm to ~4 nm.

FIGS. 4A-4B illustrate line scans for oxide surface with buried nanowires, wherein FIG. 4A shows before Atomic Layer Etch and FIG. 4B shows after Atomic Layer Etch, indicating peak to valley reduced from 50 nm to ~4 nm. In each of FIGS. 4A-4B, (i) is top view, (ii) is histogram, (iii) is profile, (iv) is power spectrum.

FIG. 5C. Example device structure planarized using the method.

FIG. 7A is a cross-sectional schematic of a lid comprising a thermal evaporator for the TE-ALD system, according to a first example, and FIG. 7B illustrates a close up cross-sectional view of a region of an underside of the lid.

FIG. 7C is a cross-sectional schematic of a lid including a thermal evaporator for the TE-ALD system, according to a second example, and FIG. 7D illustrates a close up cross-sectional view of a region of the underside of the lid.

FIG. 8A is a view of the underside of the lid, FIG. 8B is a close up view of a region in FIG. 8B.

FIG. 9A is a side view schematic illustration of the thermal evaporator including a channel, FIG. 9B is a cross-sectional view of the channel, FIG. 9C is a top view of the channel illustrating radius of curvature R.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.

Technical Description

Part A: Nano-Planarization for Improved Fabrication and Performance of Superconducting and Semiconductor Devices Atomic Layer Etching (ALE) is a method of precisely removing material from a substrate at a rate of no more than a few angstroms per second using a cyclical process. In plasma ALE, a reactive molecular gas is introduced into a vacuum chamber. A plasma is used to dissociate that gas into its atomic constituents and other activated species such as radicals, ions, and metastable excited species. Conventional plasma etching uses a biased electrode to accelerate those ions towards a substrate of interest. The ions collide with the surface and stimulate chemical reactions to occur, some of which lead to the formation of volatile products. For example, chlorine and argon gas can be combined in a plasma to form Cl atoms, Ar ions, etc. to etch silicon.

Figure 1A:
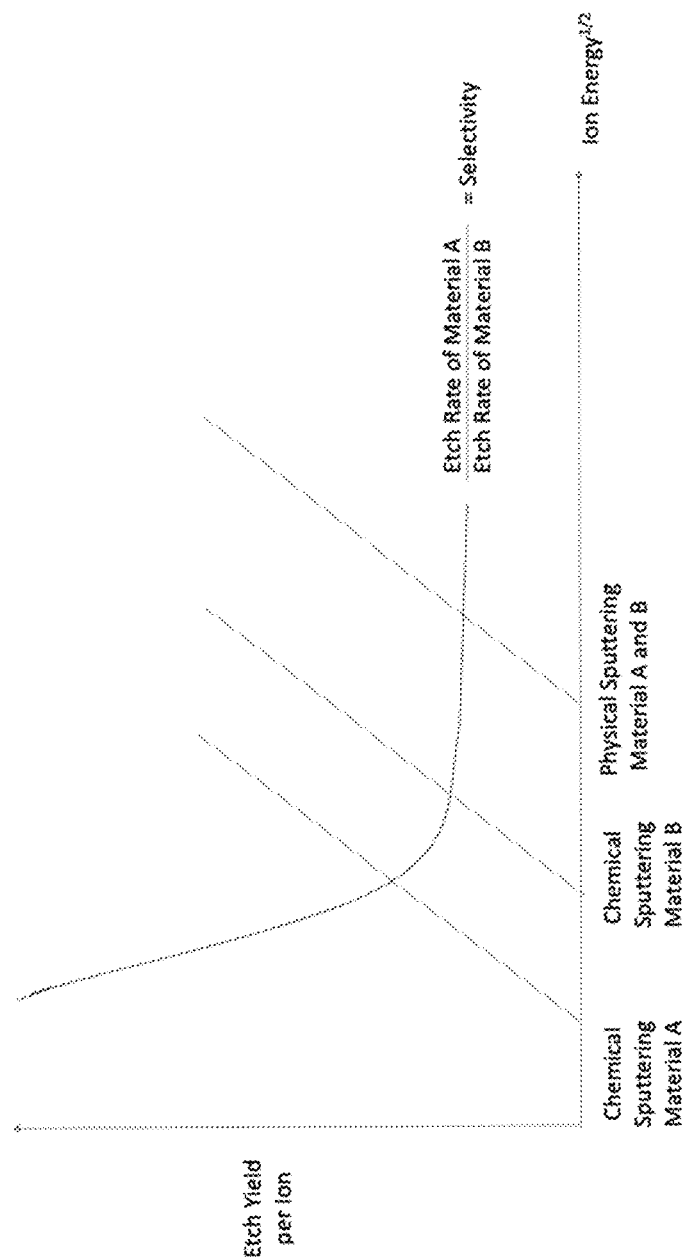
FIG. 1A. Etch Yield per Ion vs. Ion Energy.
Figure 1B:
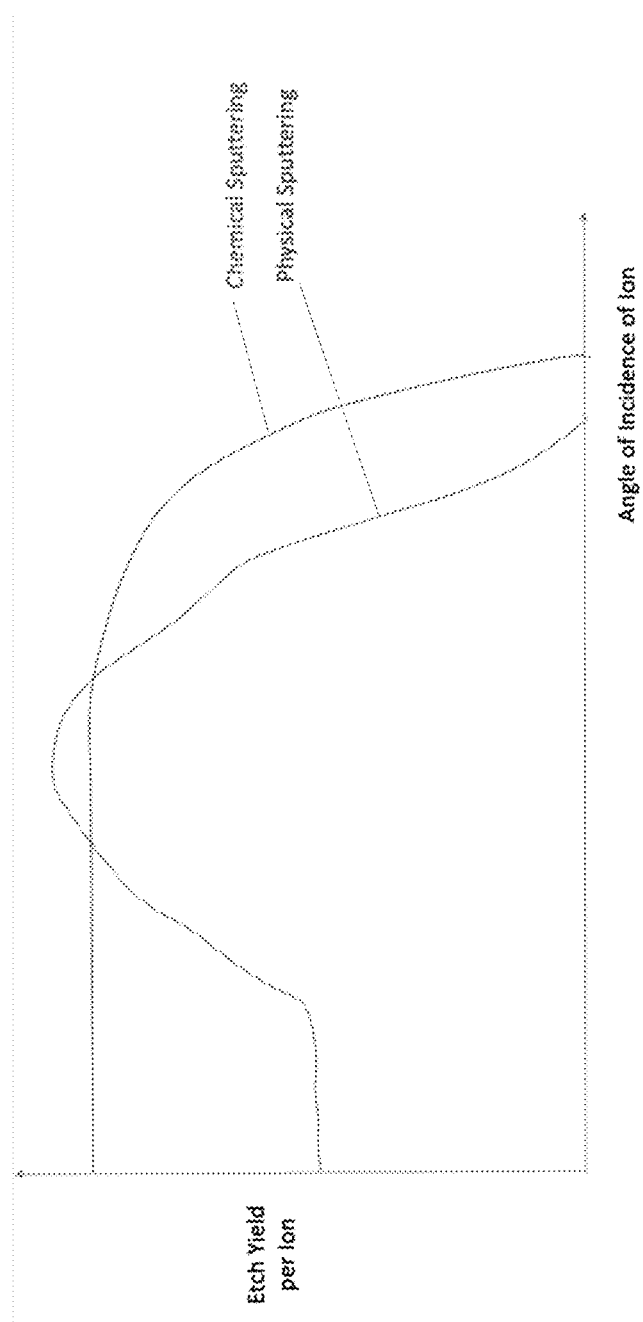
FIG. 1B. Etch Yield per Ion vs. Angle of Incidence of Ion.

FIGS. 1-3 illustrate a unique method of processing a surface using atomic layer etching, wherein the ion 200 energy, ion angular distribution, and chemistry can be precisely controlled to planarize a surface with nanometer resolution. By minimizing the ion energy, increasing the ion angular distribution (through low bias, high pressure, and chemistry) the lateral etch rate of features, protrusions 202, and roughness on the surface can be significantly increased.

First Example: Atomic Layer Etching

An example ALE process on a silicon substrate comprises the following separate discrete steps:

1. A very low power chlorine and argon plasma is used to dissociate molecular chlorine gas into chlorine atoms. Those atoms absorb to the silicon surface forming an ultrathin film of chlorinated silicon. The chlorination process stops when the layer fully covers the exposed surface 2. The chlorine gas flow is turned off, leaving a pure argon plasma behind. The residual chlorine is removed from the gas phase by being pumped out. However, the chlorinated layer on the silicon remains behind.

3. Once the chlorine is gone from the gas phase completely (purged from the chamber), a very small electrical bias is applied to the pedestal upon which the wafer is sitting. That causes argon ions to be gently accelerated towards the wafer. The energy of the ions impacting the wafer is just high enough to impart energy to the atoms in the chlorinated silicon layer. Silicon bonds to silicon break and subsequently reform by connecting silicon directly to chlorine, leading to the production of volatile species such as $SiCl_4$. Eventually, all of the chlorine in the chlorinated surface layer formed in step 1 is consumed to produce $SiCl_4$, and the reactions stop. The remaining silicon is not etched because the ion energy from the plasma bias is not sufficient to sputter silicon atoms away. Thus, this etching step is saturating because the thickness of the chlorinated layer is defined and controlled by step 1.

4. The bias is removed and the ion bombardment stops. The $SiCl_4$ reaction products are pumped away and the plasma chamber and wafer surface have been renewed.

The process repeats cycling from steps 1 to 4 until the desired amount of material is precisely removed.

Second Example: Etching of Devices Including Wires

Superconducting nanowire based devices are becoming more complex as their functionality is increased. It is now advantageous to use multiple layers of nanowires in a device. However, these multilayers become very difficult to integrate together because the topology that is created is significant compared to the thickness of the layers being deposited. This is not an unusual phenomenon at the micron scale and has been resolved at the microns scale using chemical-mechanical planarization/polishing. However, the dimensions of the wiring and the topology in many applications are at or near a nanometer scale and it impossible to use an abrasive technique such as chemical-mechanical polishing to mitigate topology irregularities detrimental to layer integration at the nanometer scale.

Figure 3A:
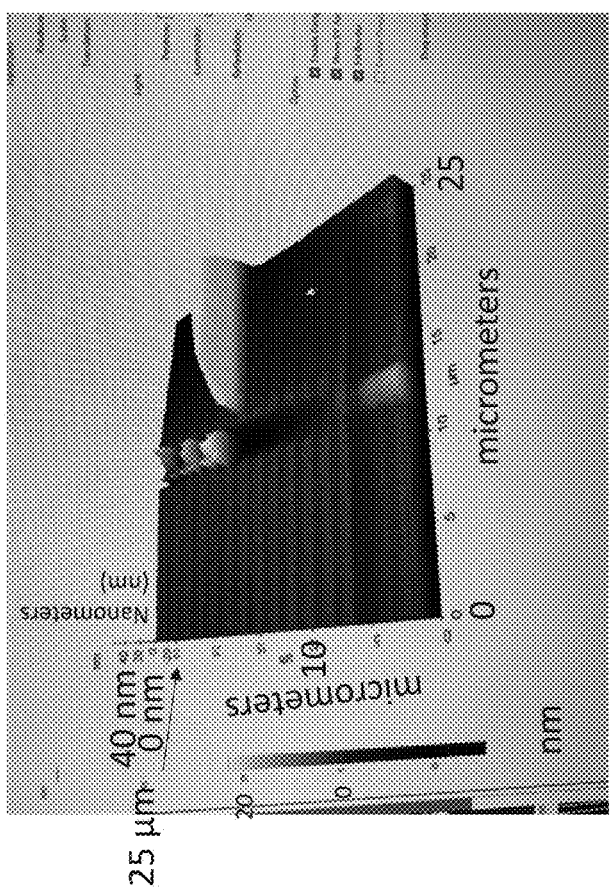

Consider the case of a buried nanowire WSi line that is 50 nm tall and 500 nm wide and a dielectric insulating layer deposited over it to isolate it from subsequent layers of metallization. FIG. 3A shows the topology of the wire on top of a flat substrate is preserved, even after the dielectric layer is applied. This topology (roughness) is problematic for subsequent integration schemes, as subsequent wiring can be relatively thin (5 nm) as compared to the total amount of topology that it has to traverse (40 nm), increasing the likelihood that openings form and expose the wiring to damage.

Figure 3B:
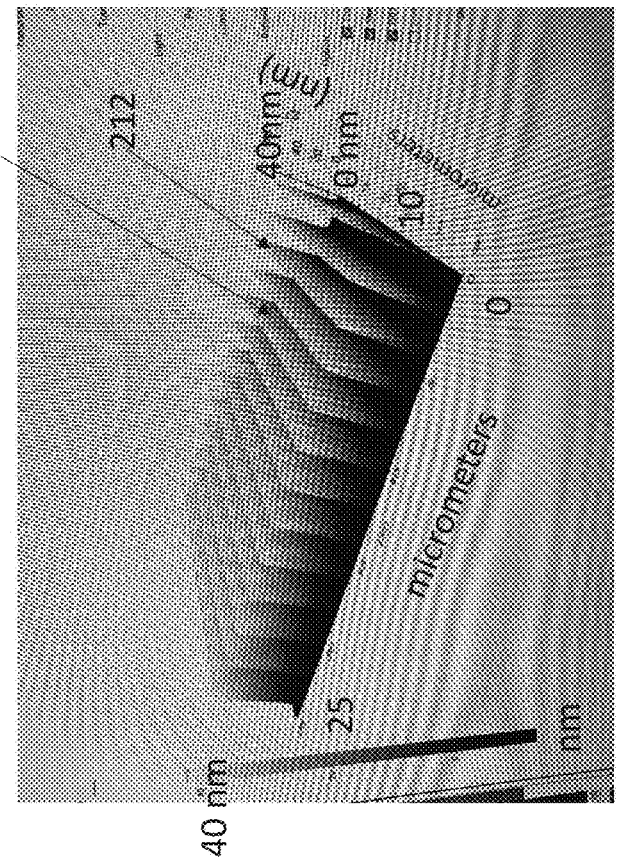

FIG. 3B shows how an ALE process (e.g., completely) eliminates the submicron scale roughness in a manner that is not achievable by any other etching or polishing process. This nano-planarization approach with ALE can controllably remove the large protrusions in the dielectric layer (caused by underlying wiring) in a quasi-conformal fashion, because the sidewalls of the protrusions have a portion of their projected area that is exposed to the argon ions from the plasma. In addition, since the bias voltage in step 3 is low, the ion transit time through the plasma sheath to the wafer is relatively long (as compared to conventional etching). The longer ion transit time results in a broader ion angular distribution impacting the wafer, including the ions having trajectories incident on the substrate at angles up to nearly 10 degrees off normal, as compared to incident angles 1-2 degrees off normal that are achieved using higher biases during conventional etching. The broader ion angular distribution leads to a substantially greater lateral etch rate so that the protrusions are etched from all sides. Ultimately, the protrusions can be eliminated or nearly eliminated, leaving a flat surface upon which subsequent processes can be performed (such as the deposition and patterning of additional layers of wiring).

Example Process Steps

Figures 4A, 4B:
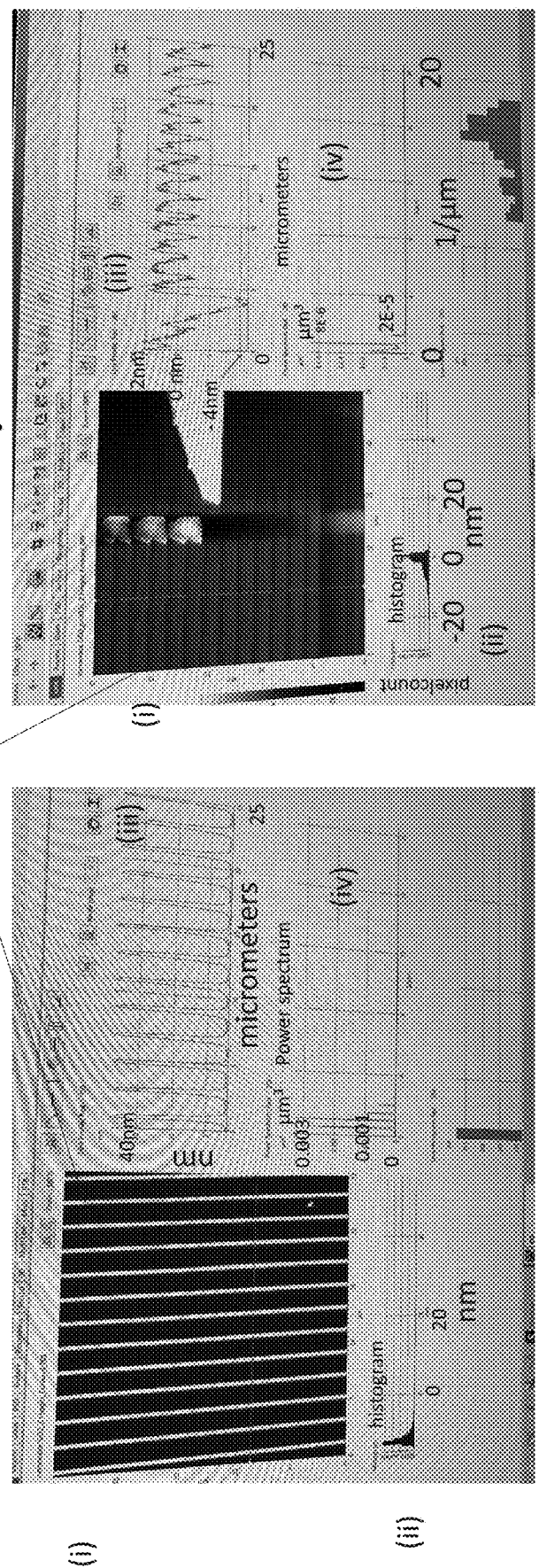
Figure 5A:
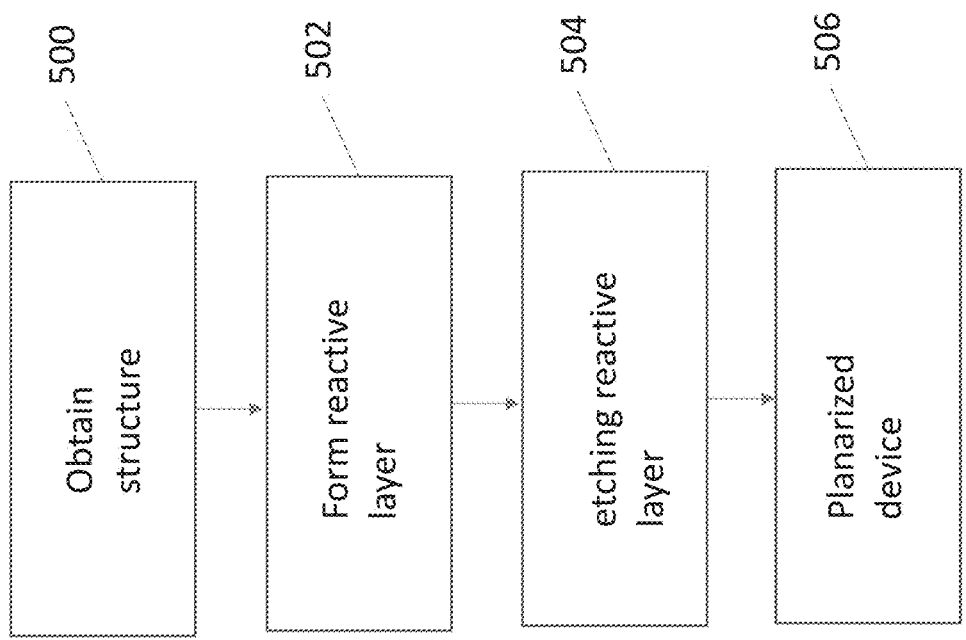
FIG. 5A. Flowchart illustrating a method of etching.

FIG. 5 is a flowchart illustrating a method of etching a substrate (referring also to FIGS. 1-5C).

Block 500 represents obtaining a structure comprising a plurality of nanowires on or above a substrate and a dielectric layer 212 on or above the nanowires, wherein the dielectric layer comprises protrusions formed by the underlying nanowires.

Block 502 represents reacting a surface of the dielectric layer with a reactant, comprising a gas or a plasma, to form a reactive layer on the dielectric layer. The reactive layer comprises a chemical compound including the reactant and elements of the dielectric layer. The reactive layer further comprises the protrusions 202 having sidewalls 204 (see FIG. 2).

Block 504 represents etching the reactive layer and the protrusions laterally through the sidewalls so as to planarize the surface and remove or shrink the protrusions.

Block 506 represents the end result, a planarized device comprising the structure (see also FIGS. 5C, 3B, and 4B).

Illustrative, non-exclusive examples the method and device structures manufactured using the method include the following (referring also to FIGS. 1-5C).

1A. A method for etching a surface, comprising:
(a) obtaining a structure comprising a plurality of nanowires 530, 215 on or above a substrate 532 and a dielectric layer 212 on or above the nanowires, wherein the dielectric layer comprises protrusions 202 formed by the underlying nanowires;
(b) reacting a surface 206 of the dielectric layer with a reactant, comprising a gas or a plasma, to form a reactive layer 214 on the dielectric layer, wherein the reactive layer 214 comprises a chemical compound including the reactant and elements of the dielectric layer and the reactive layer comprises sidewalls 204 defined by the protrusions; and
(c) selectively etching the reactive layer 214 wherein the etching etches the protrusions 202 laterally through the sidewalls 204 so as to planarize the surface 536 and remove or shrink the protrusions 202. In one or more examples, the selective etching is such that the etch rate of the reactive layer is at least 10 times faster compared to the etching of the dielectric layer.

1B. The method wherein the etching comprises reacting the reactive layer 214 with an agent 200 that induces a re-arrangement of chemical bonds between constituents of the reactive layer 214 and wherein the re-arrangement removes the reactive layer from the surface.

Figure 2D:
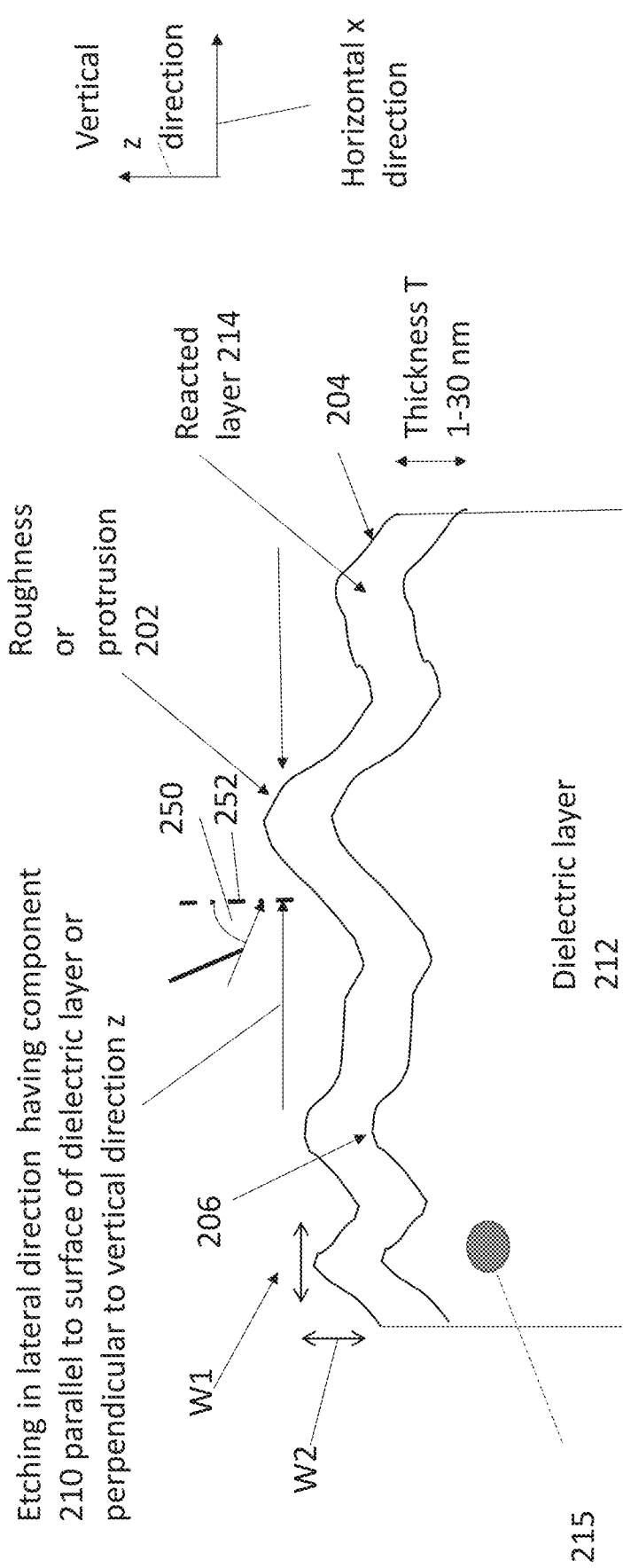

1. The method of example 1A or 1B wherein the reacting comprises projecting the agent 200 onto the surface 206 (e.g., as illustrated in FIGS. 2A and 2D) with an energy:
below that required for physical sputtering of the surface using the agent so that the material is not ejected from the substrate by a physical sputtering process, and
sufficient to act as a catalyst for the re-arrangement.

2. The method wherein the agent of example 1A or 1B comprises ions 200.

3. The method of any of the examples 1A-2 wherein the etching comprises accelerating ions 200 onto the surface 206 so that a majority of the ions impact the surface at an angle 250 of at least 10 degrees with respect to a vertical direction z or to a surface normal 252 normal to the surface 206.

4. The method of any of the examples 1A-3 wherein the etching comprises accelerating ions 200 onto the reactive layer 214 along a direction having a larger component 210 parallel to a surface of the reactive layer 214 (e.g., accelerating the ions in a direction having a larger component 210 parallel to a horizontal direction x perpendicular to the vertical direction z), as compared to the component normal to the surface that is parallel to the vertical direction z.

5. The method of any of the examples 1-4 wherein the etching comprises chemical sputtering.

6. The method of any of the examples 1-5 wherein the reactive layer 214 comprises valleys having sidewalls 204 and the etching etches the valleys laterally through the sidewalls so as to planarize the surface 206 and remove or connect the valleys.

7. The method of example 6, wherein the valleys have a height W2 and width W1 in a range of 1-100 nm.

8. The method of any of the examples 1-7 wherein the reactant comprises at least one of a halogen that halogenates the surface, a sulphide so as to form the reactive layer comprising a sulphide, hydrogen or a hydride so as to form the reactive layer comprising a hydride, a nitride or nitrogen so as to form the reactive layer comprising a nitride, or oxygen or an oxide so as to form the reactive layer comprising an oxide.

9. The method of any of the examples 1-8 wherein the structure 528 comprises a electrical circuitry including the nanowires 530, 215, the method further comprising electrically contacting the nanowires through the dielectric layer with wires or components in different layers of a multilayer device.

10. The method of any of the examples 1-9 wherein the nanowires 215, 530 comprise WSi.

11. The method of any of the examples 1-10 wherein the substrate 532 comprises silicon, the nanowires 215, 532 comprise metal, the dielectric layer 214 comprises silicon dioxide.

13. The method of any of the examples 1-13, wherein the reactive layer 214 comprises chlorinated silicon, the reactant comprises chlorine, and the etching agent 200 comprises argon ions.

14. The method of any of the examples 1-13 further comprising repeating the reacting and etching steps so as to perform a plurality of etching cycles each comprising the reacting and the etching, wherein:
the cycles include a first cycle and a second cycle subsequent to the first cycle,
the second cycle forms the reactive layer that is thinner as compared to the reactive layer formed in the first cycle, so that the etching in the second cycle etches the reactive layer with a finer resolution as compared to the etching in the first cycle.

15. An electrical circuit manufactured using the method of any of the examples 1-14.

16. A device structure 528, comprising:
a plurality of nanowires 215, 530 on or above a substrate 532, wherein the nanowires each have a width in a range of 1-500 nanometers;
a dielectric layer 534 having a thickness T less than 1000 nm on or above the nanowires, wherein the dielectric layer comprises an etched surface 536 having a surface roughness of less than 5 nanometers.

17. The device structure of example 16, wherein the dielectric layer 534 comprises protrusions 202 formed by and aligned with the underlying nanowires 215, 530 and the protrusions have a height W2 and a width W1 less than 5 nanometers.

18. The device of example 16 or 17, wherein dielectric layer 534 comprises valleys having laterally etched sidewalls.

19. The device of any of the examples 16-19, further comprising one or more layers including wiring on or above the dielectric layer.

20. The device structure of any of the examples 16-19 manufactured by a process comprising:
(a) obtaining a structure comprising the dielectric layer 534, 212 on or above the nanowires 215, 530, wherein the dielectric layer comprises protrusions formed by the underlying nanowires;
(b) reacting a surface 206 of the dielectric layer with a reactant, comprising a gas or a plasma, to form a reactive layer 214 on the dielectric layer, the reactive layer comprising a chemical compound including the reactant and the dielectric layer, wherein the reactive layer comprises sidewalls defined by the protrusions; and (c) selectively etching the reactive layer 214, wherein the etching etches the protrusions 202 laterally through the sidewalls 204 so as to planarize the surface 206 and remove or shrink the protrusions 202.

21. The method or device of any of the examples 1-21, wherein the nanowires 215, 530 comprise metal wires having a diameter of 10 nanometers or less.

22. The method or device of any of the examples 1-21, wherein the nanowires comprise a superconductor.

23. The method or device of any of the examples 1-22 comprising a stack of multiple layers comprising the nanowires 215, 530 between dielectric layers 212, 532, wherein one or more of the dielectric layers 212, 532 are planarized using the method of any of the examples 1-22.

Figure 5B:
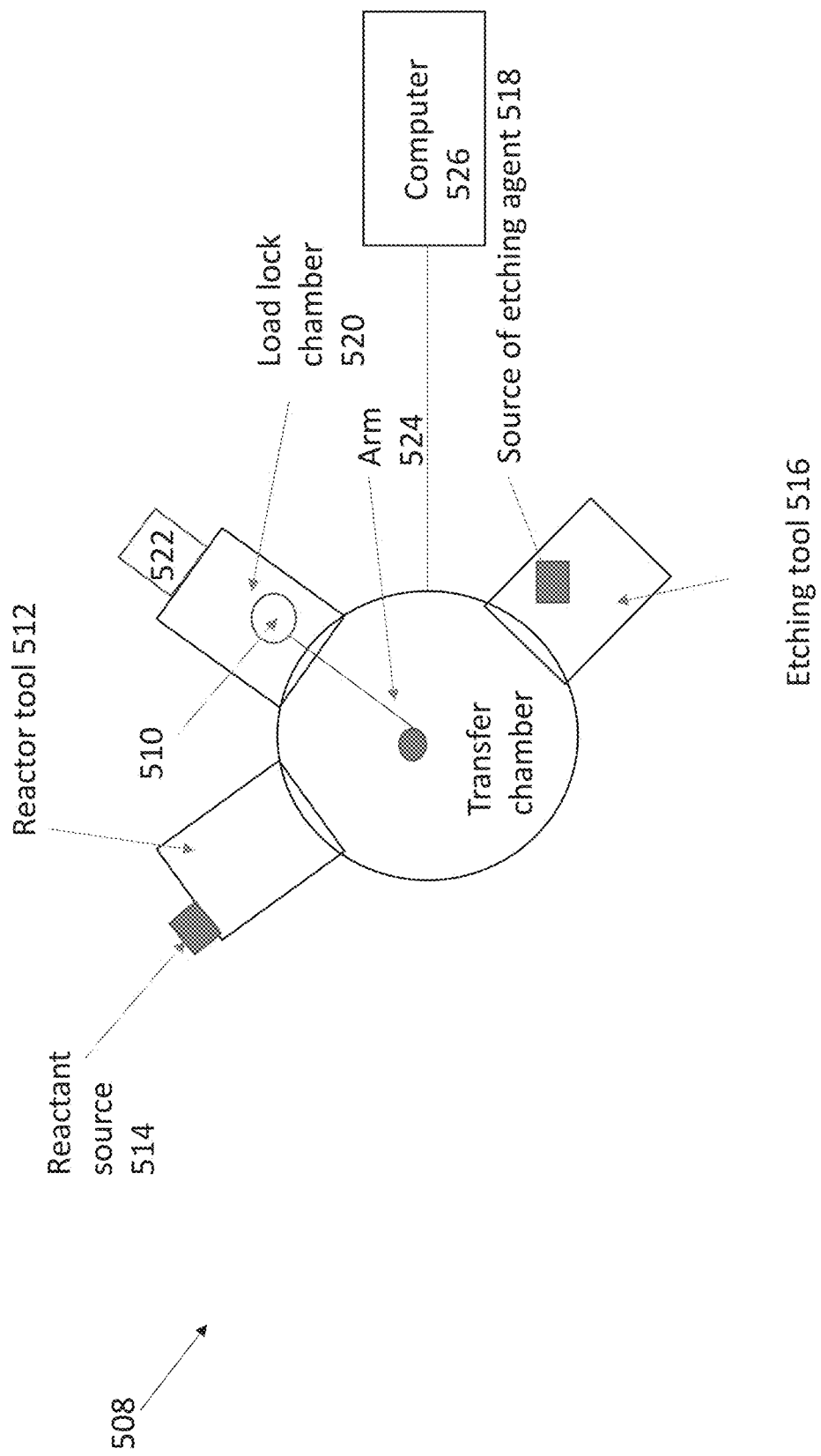
FIG. 5B. Apparatus for etching.
Figure 6:
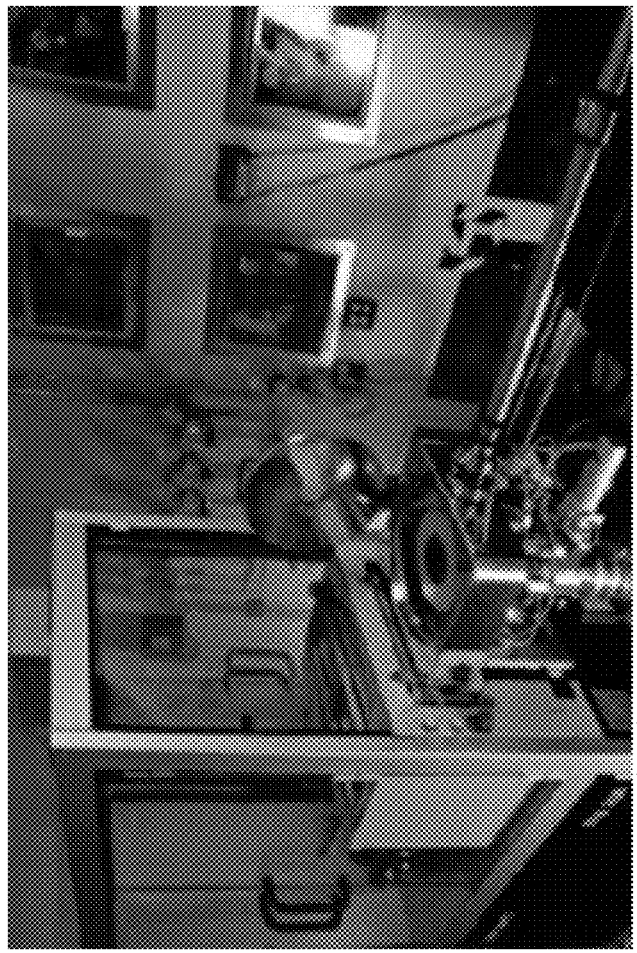
FIG. 6 illustrates a thermal evaporator-atomic layer deposition (TE-ALD) system.
Figure 8C:
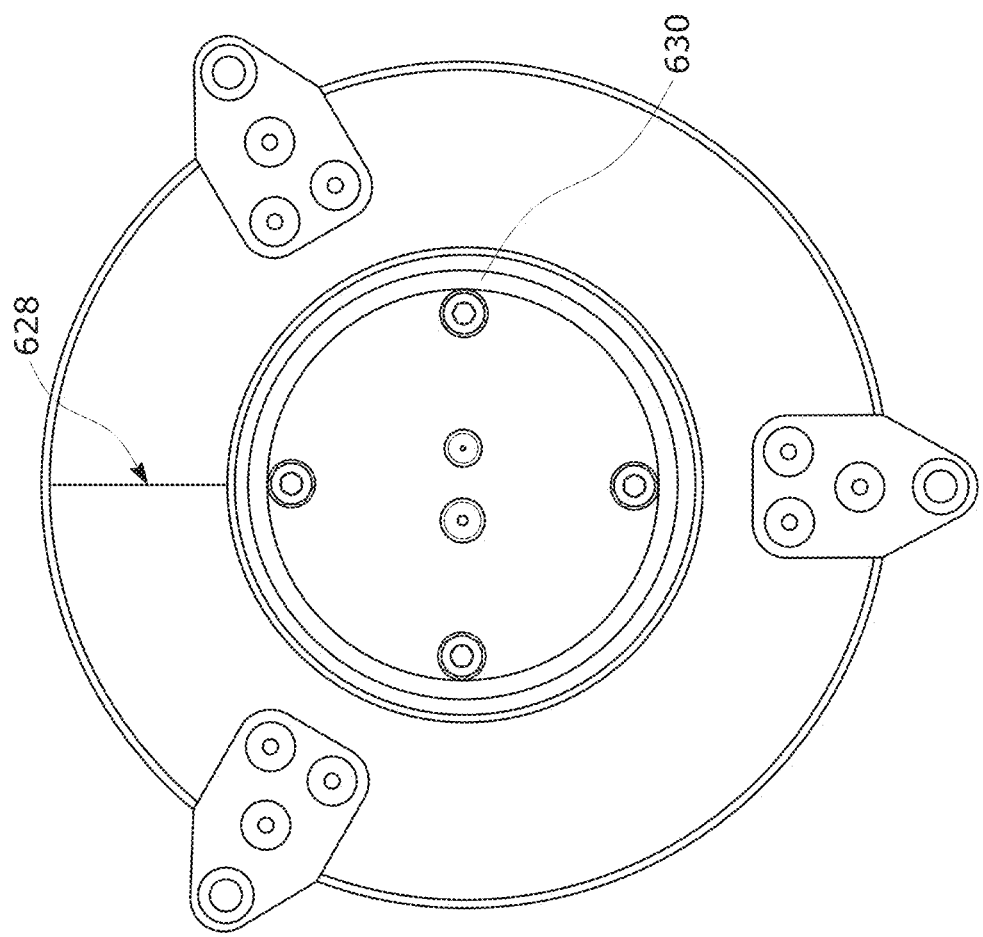
FIG. 8C is a view of the underside of the lid showing the evaporation boat indicator.
Figure 9D:
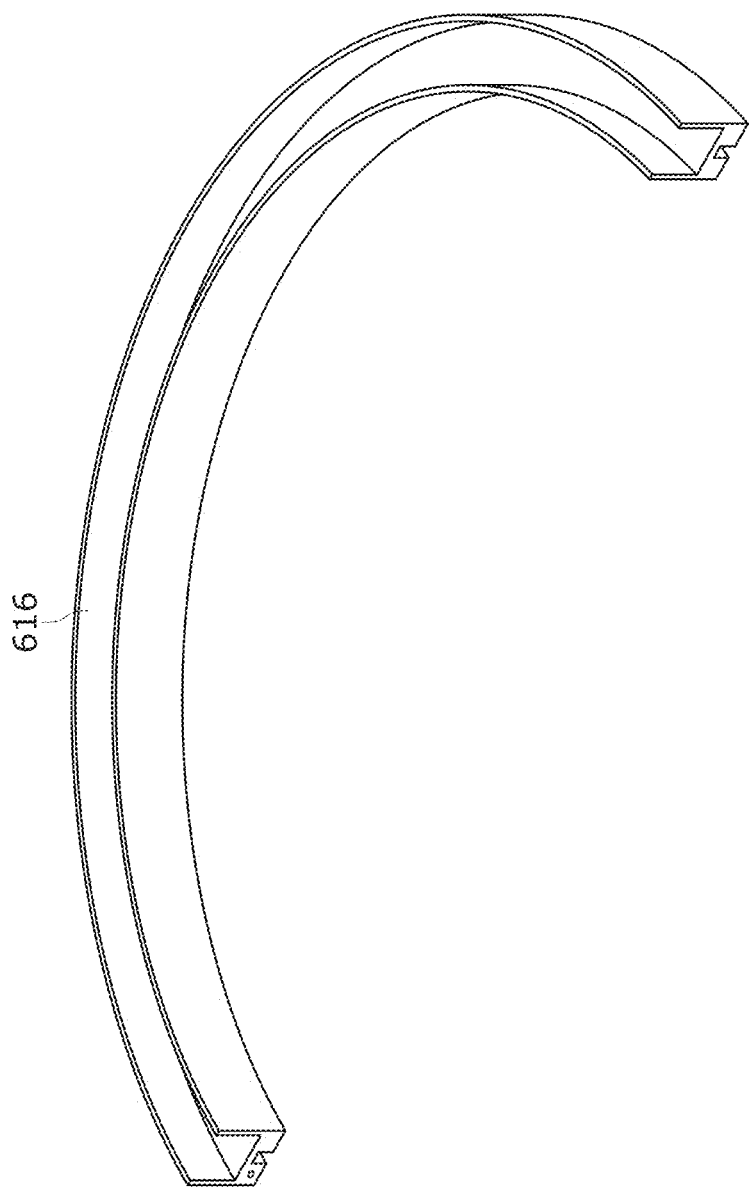
FIG. 9D is a perspective view of the channel.

FIG. 5B illustrates an apparatus 508 (e.g., cluster tool) for etching a substrate 510, comprising one or more reactor tools 512 (comprising a source 514 of reactant) and one or more etching tools 516 (comprising a source 518 of an etching agent) coupled to the reactor tools. The reactor tools react a reactant with a surface of a dielectric layer so as to form a reactive layer on the dielectric layer, wherein the reactant comprises a gas or plasma, wherein (1) the reactive layer comprises a chemical compound including the reactant and elements of the dielectric layer; and (2) the dielectric layer comprises protrusions formed by the underlying nanowires. The one or more etching tools selectively etch the protrusions laterally through the sidewalls so as to planarize the surface and remove or shrink the protrusions. The apparatus 508 further comprises a load lock chamber 520 for loading the substrate 510 comprising a material into the apparatus; a loading port 522 for loading the substrate into the load lock chamber; one or more arms 524 for transferring the substrate between the tools 512 and 516, and a computer 526 for controlling the tools 512, 516 and apparatus 508.

FIG. 5C illustrates a device structure 528, comprising a plurality of nanowires 530 on or above a substrate 532, wherein the nanowires each have a width W or diameter in a range of 1-500 nanometers; and a dielectric layer 534 having a thickness T less than 1000 nm on or above the nanowires, wherein the dielectric layer comprises an etched surface 536 having a surface roughness of less than 5 nanometers. In the example shown, the device includes a stack including a plurality of layers of nanowires and a plurality of dielectric layers.

Possible Modifications

The nano-planarization techniques can be used for a wide variety of materials including, but not limited to, YBCO, WSi, semiconductors (e.g., amorphous silicon, InP), and $SiO_2$.

Advantages and Improvements

The underlying physics of the ALE process has some profound implications for topology control. First, and most importantly, chemically enhanced sputtering (as is described in step 3 above) is fundamentally different than pure physical sputtering. Since the etching process in chemically enhanced sputtering operates through deposition of energy to achieve chemical rearrangement (rather than ejection of atoms through elastic recoil as in physical sputtering), the angular dependence of the etching yield of an incoming ion is fundamentally different. Purely physical sputtering processes have a substantial peak in their etching yield at around 45 degrees of ion incidence, leading to faceting where etching along certain angles is preferred, and potentially resulting in undesirable surface morphologies. Chemical sputtering, on the other hand, is largely independent of ion angle and therefore enables all surfaces of a peak on a surface to be etched at roughly the same etch rate.

Part B: Integrated Thermal Evaporation with Atomic Layer Deposition (TE-ALD)" Process Atomic layer deposition (ALD) is a chemical technique that can deposit extremely conformal and uniform films with angstrom level precision. ALD is used to fabricate a wide variety of devices from semiconductor chips, memory, detectors, etc.

However, one significant limitation of the ALD technique is that it is confined to those films that can be achieved through equilibrium processes. This is a significant limitation when a portion of the composition being deposited is deficient, as deposited. One such example is magnesium diboride ($MgB_2$). Magnesium diboride is a simple ionic binary compound that has proven to be an inexpensive and useful superconducting material. However, Mg is deficient as deposited in conventional ALD processes and only stoichiometric $MgB_2$ is a superconductor.

Example 1: Thermal Evaporation-Atomic Layer Deposition (TE-ALD) Reactor

FIGS. 6-10 illustrate an apparatus (TE-ALD reactor) 600 for depositing a material, comprising a thermal evaporator 602 coupled to/integrated with a reactor 1000 (e.g., ALD or CVD system). The thermal evaporator applies electrical current 606 generating heat used to evaporate a first source material 1001 from a charge 1002 to form a first precursor 1004 in a first gaseous phase. The reactor comprises a reaction chamber 1006, an inlet 1008 to the reaction chamber, and an outlet 1009 from the reaction chamber.

The apparatus further includes a computer 1400 coupled to the thermal evaporator and the reactor. The computer 1400 controls a sequential reaction of a surface 1010 of a substrate 1012 with the first precursor 1004 and a second precursor 1014 comprising a second source material. The controlling comprises:

(1) controlling a flow rate of an inert gas 1111 through the inlet 1008, the inert gas transporting the first precursor to the surface 1010 of the substrate mounted in the reaction chamber 1006;

(2) adjusting a flow of the electrical current to control a temperature of the charge (e.g., using a thermocouple 608); and (3) after the reaction, controlling a purging of the first precursor 1004 or the second precursor 1014 from the reaction chamber 1006 through the outlet 1009; and so as to deposit an amount of the first source material that forms the material 1020 comprising a stoichiometric combination of the first source material and the second source material.

Figure 10:
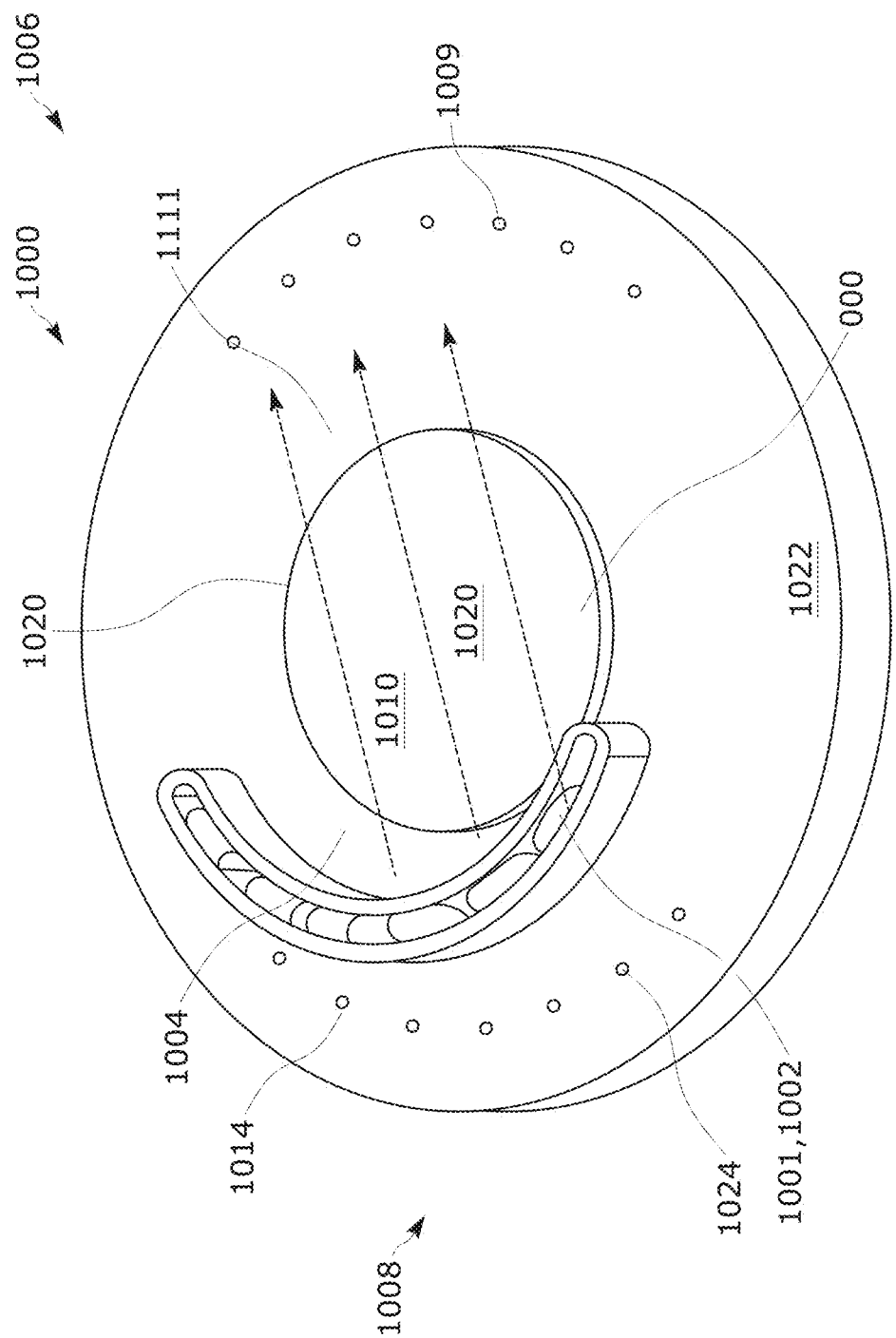
FIG. 10 illustrates the reaction chamber and flow of precursor from the thermal evaporator channel to the wafer.
Figure 11:
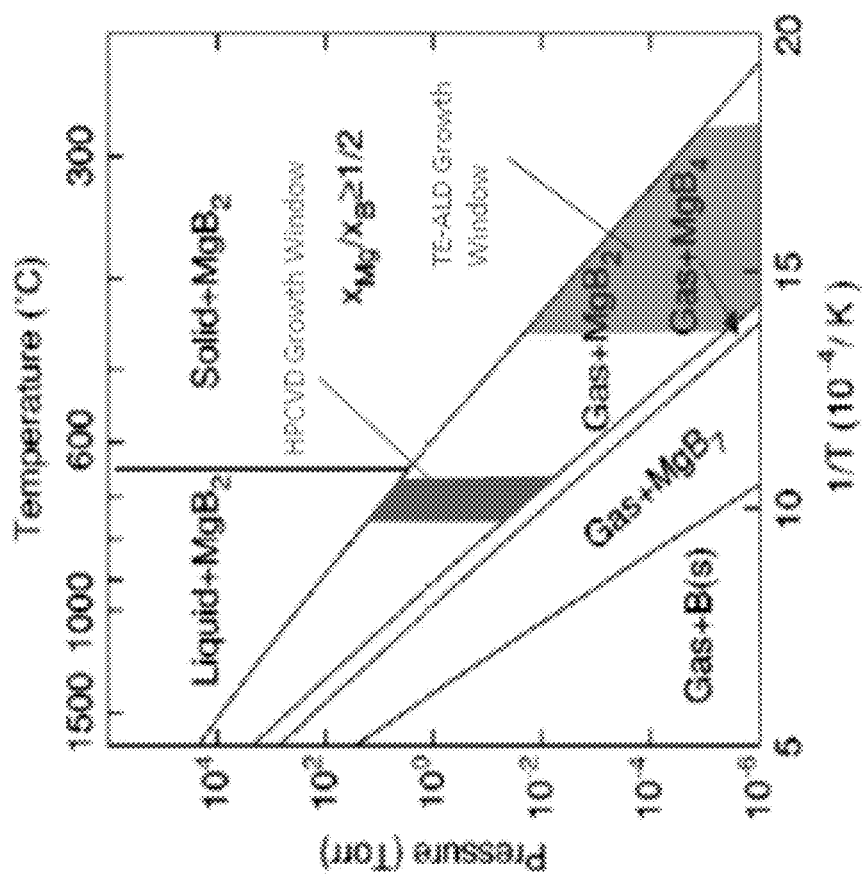
FIG. 11 shows pressure and temperature ranges for TE-ALD deposition of stoichiometric magnesium diboride.

FIGS. 7A-7D, 8A-8C, and 9A-9D illustrate the TE-ALD reactor includes a modified lid 610 for the reactor, wherein the lid is machined to include a channel 612. FIGS. 7A-7D illustrate a thermal coaxial cable 614 integrated at the bottom of the channel allows the channel to act as an evaporation boat 616. FIG. 10 shows inert gas passed over the channel carries the first precursor (e.g., elemental metal vapor) away from the boat 616 and on to the wafer. In one or more examples, the thermal coaxial cable 614 carries the electrical current 606 and the thermo coax cable 614 is in a groove 617 thermally coupled to the charge to transfer the heat to the charge. Also shown are adaptors 618, 620 for electrically connecting to the thermo coaxial cable 614 and thermocouple 608, respectively. In one or more examples, the reactor and thermal evaporator may be evacuated and can maintain a vacuum. Also shown are grounding points 622, bolts 624 disposed in a circle or bolt circles for placement of different orientations of the boat 616, the coaxial cable cold end 626, evaporation boat indicator 628 and o-ring 630 (e.g., for sealing), and blind holes 632 for the thermocouple 608.

Example 2: Deposition Process

The following process steps describe a method for deposition of magnesium diboride using the apparatus illustrated in FIGS. 6-10.

1. If necessary, clean metal (e.g., magnesium) pellets to remove surface oxides (e.g. weak HCl in ethanol for Mg)

2. Load the thermal evaporator with a charge of the desired material to be evaporated (e.g. Mg pellets).

3. Install thermal evaporator head on ALD system ensuring the metal pellets are in a boat that can contain them should they accidentally melt. Note that the boat shape is designed to ensure a uniform partial pressure of the evaporating metal (for example, a stove top coil). Note also that the metal does not need to be evaporated in a boat—the metal could be a wire and electrical current can be passed through the metal shaped wire so as to evaporate the metal.

4. Pump down the TE-ALD system, and as necessary, heat up to deposition temperature (but below the evaporation temperature). Use an inert gas or hydrogen to ensure that the system is dried out by baking. Bake time depends on the film that one wishes to deposit, but often can be overnight.

5. Slowly ramp the temperature of the boat (or wire) by increasing the electrical current applied. Once the desired temperature is reached (which is often the temperature where the metal evaporates at a low level without melting e.g., 650° C. for Mg), allow the system to stabilize.

6. Proceed with the ALD or pulsed CVD deposition until the desired film thickness is achieved.

7. Dopant metal concentration can be controlled by evaporation temperature (and thus partial pressure), deposition cycle time (such as purge time which removes the ALD precursors but not the dopant metal), precursor choice, and metal charge shape and thickness and height with respect to the sample being coated.

When the sample is removed, the metal charge should be cooled down before venting the chamber or can be left hot for additional samples to be processed.

Example Results: Deposition of Magnesium Diboride $MgB_2$ thin films can be grown using hybrid physical/chemical vapor deposition as superconductors when there is an excess of magnesium in the gas phase. The method includes a charge of magnesium metal that is heated above its sublimation temperature. However, this method is only appropriate for small samples (1" in diameter) and for thick films (100 nm or thicker).

Figures 12A, 12B:
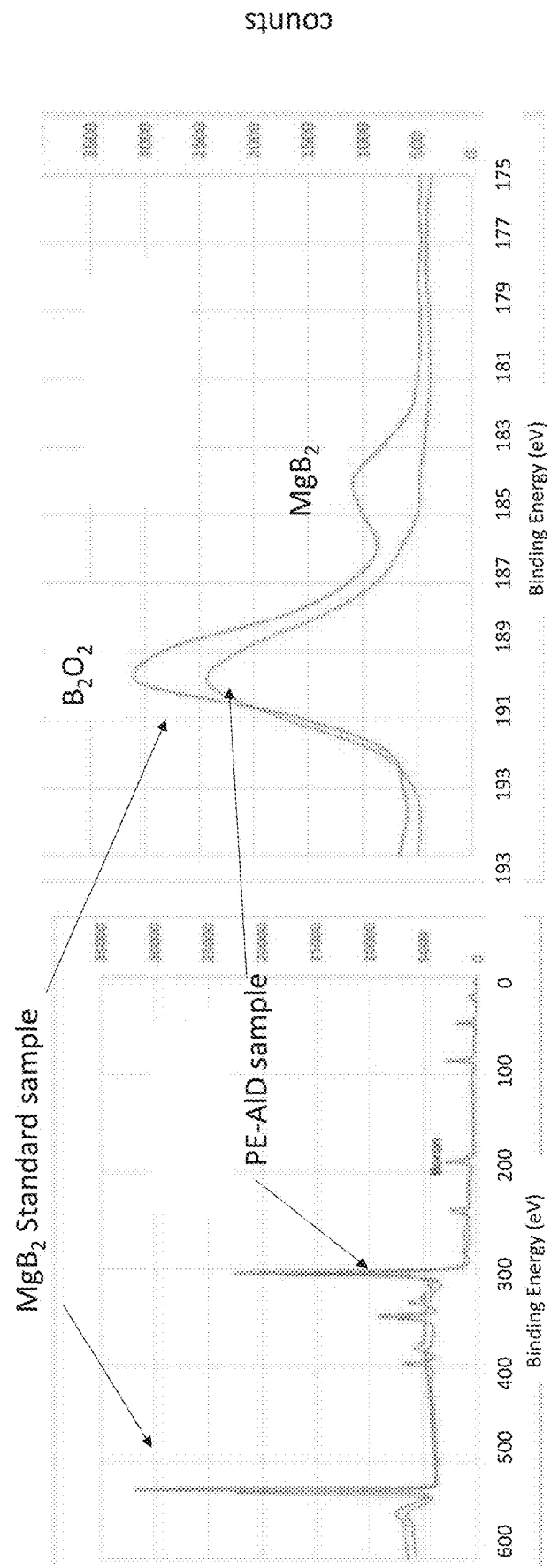
FIG. 12A-12B illustrate X-ray photoelectron (XPS) spectroscopy characterization of magnesium and boron content in a film deposited using plasma enhanced ALD.

FIG. 12A-12B illustrate a $MgB_7$ film is typically deposited using plasma-enhanced ALD. The film is highly resistive and non-superconducting, likely due to the low magnesium incorporation.

Figures 12C, 12D:
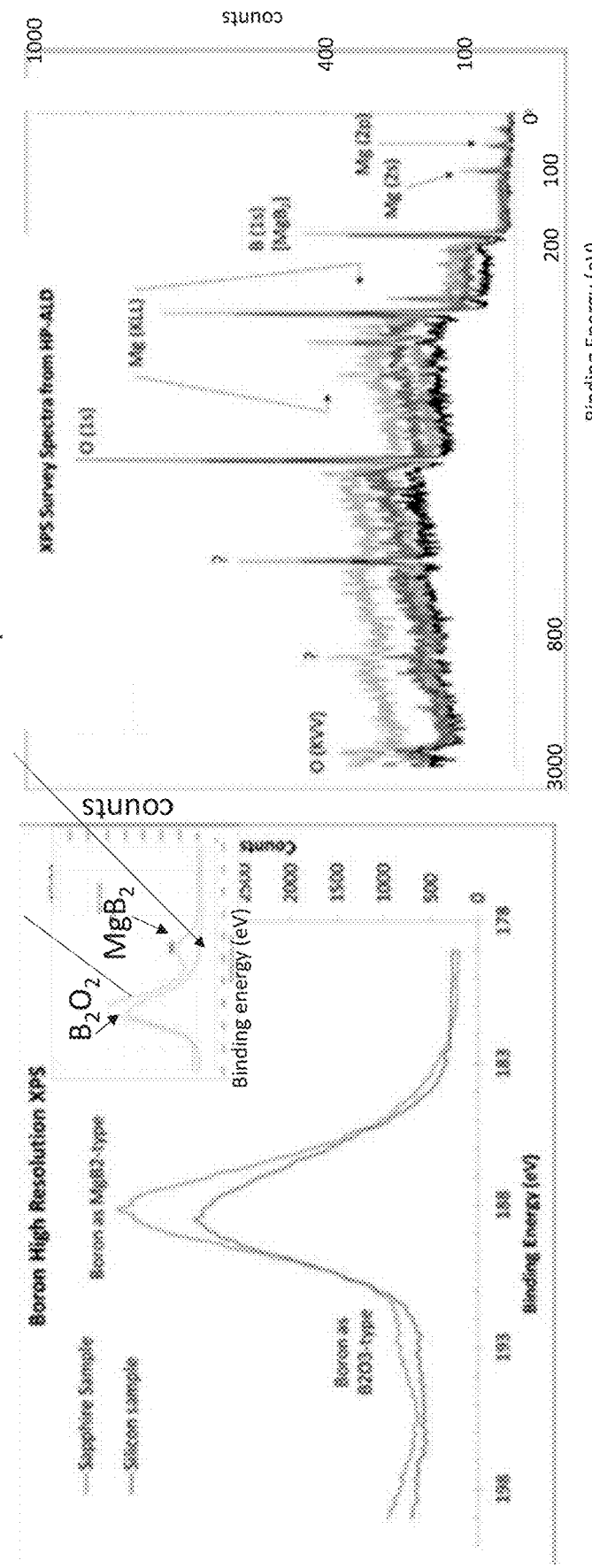
FIG. 12C-12D illustrate XPS spectroscopy characterization of magnesium and boron content in a film deposited using TE-ALD.
Figure 12E:
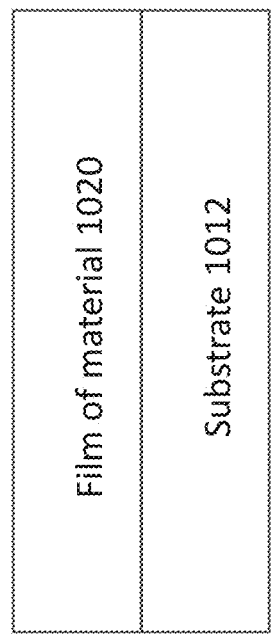
FIG. 12E is a cross-sectional schematic of a film comprising the material on a substrate manufactured using the TE-ALD.

FIG. 12C-12D illustrate stoichiometric $MgB_2$ deposited using the TLD-ALD reactor of example 1 and the deposition method of example 2. The $MgB_2$ film is highly conductive (~16 ohm/square for a 100 nm thick film. In one or more examples, and capping layer (e.g., AlN) can be deposited on top of the $MgB_2$ film to prevent film degradation. In yet further examples, pressure and temperature are controlled to ensure magnesium saturation.

Films other than $MgB_2$ can also be deposited using the TE-ALD apparatus implementing the stoichiometry control described herein.

Example Process Steps

Figure 13:
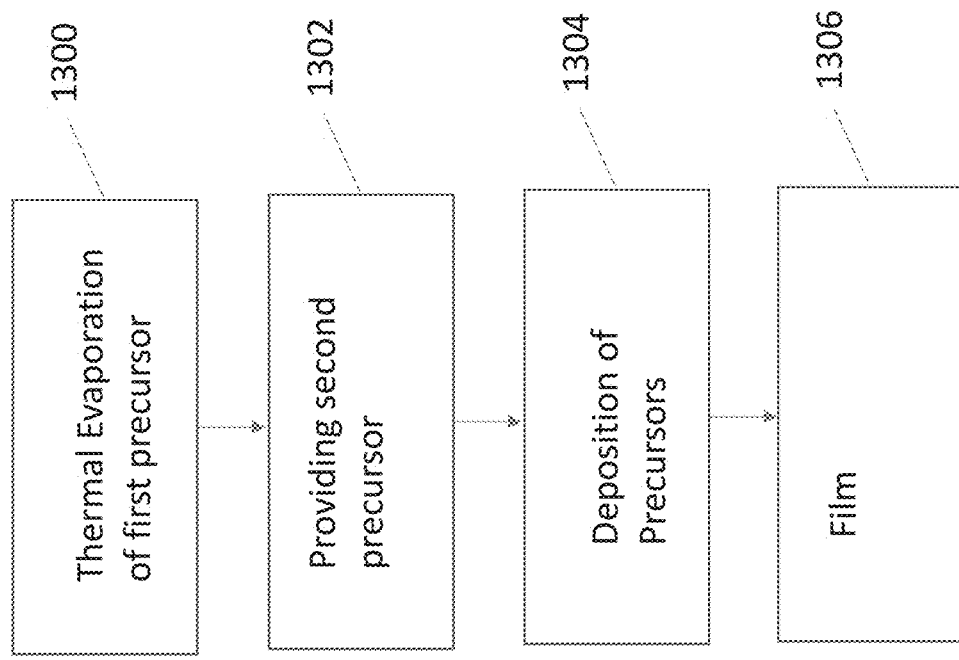
FIG. 13 is a flowchart illustrating a method of deposition using TE-ALD.

FIG. 13 is a flowchart illustrating a method of depositing a material.

Block 1300 represents thermally evaporating a first source material, at an evaporation temperature, to form a first precursor in a first gas phase;

Block 1302 represents providing a second precursor comprising a second source material in a second gas phase; and Block 1304 represents depositing the material using a reactor 600, comprising reacting a surface of a substrate with the first precursor and the second precursor in sequence. The reacting with the first precursor comprises (1) transporting the first precursor to the surface using an inert gas having a flow rate; and (2) adjusting the flow rate and the evaporation temperature; so as to deposit and amount of the first source material that forms the material comprising a stoichiometric combination of the first source material and the second source material.

Block 1306 represents a film deposited using the method.

Illustrative, non-exclusive examples the method and device structures manufactured using the method include the following.

1. A method of depositing a material; comprising:
   thermally evaporating a first source material, at an evaporation temperature, to form a first precursor in a first gas phase;
   providing a second precursor comprising a second source material in a second gas phase; and
   depositing the material by atomic layer deposition, comprising:
      reacting a surface of a substrate with the first precursor and the second precursor in sequence, wherein the reacting with the first precursor comprises:
         transporting the first precursor to the surface using an inert gas having a flow rate; and
         adjusting the flow rate and the evaporation temperature;
      so as to deposit and amount of the first source material that forms the material comprising a stoichiometric combination of the first source material and the second source material.

2. The method of example 1 wherein the evaporation temperature is a sublimation temperature of the first source material.

3. The method of examples 1 or 2 wherein the flow rate and the evaporation temperature are such that the first source material saturates a surface of the substrate.

4. The method of any of the examples 1-3 wherein the first source material comprises magnesium, the second source material comprises boron, the first precursor comprises elemental magnesium, and the material comprises $MgB_2$.

5. The method of any of the examples 1-4 further comprising depositing the material having a thickness of 100 nm or less over the surface having an area of at least 2 inches by 2 inches.

6. The method of any of the examples 1-5 wherein the thermal evaporating comprises heating a charge comprising the first source material, wherein the charge is shaped so as to distribute the first precursor with a uniform partial pressure above a surface area of the charge.

7. The method of any of the examples 1-6 wherein the thermal evaporating comprises:

flowing electrical current through a charge comprising the first source material or through a wire thermally coupled to a boat containing the first source material, wherein the electrical current generates heat heating the charge to the evaporation temperature so as to form the first precursor flowing into a cross flow of the inert gas.

8. The method of example 7, wherein the boat comprises an annular channel curving around a portion of the substrate.

9. The method of example 7, further comprising:

providing a flow of the second precursor through openings in a base plate, so that the second precursor flows vertically into the cross flow and is transported by the inert gas to the surface of substrate mounted on the base plate.

10. The method of example 9 wherein the openings are further from the substrate than the charge.

11. The method of any of the examples 1-10 further comprising:

cleaning a charge comprising the first source material;
loading the charge in a thermal evaporator;
evacuating a reaction chamber coupled to the thermal evaporator;
baking the reaction chamber and the thermal evaporator at a baking temperature below the evaporation temperature;
thermally evaporating the first source material in the thermal evaporator, comprising increasing an electrical current through the charge or an electrical wire thermally coupled to the charge, so as to gradually ramp the temperature of the charge to the evaporation temperature;
depositing the material, on the surface of the substrate in the reaction chamber, using the atomic layer deposition and one or more deposition cycles to achieve a desired thickness of the material, each deposition cycle comprising:
(i) exposing the surface to a precursor, for an exposure time, the precursor comprising the first precursor or the second precursor;
(ii) after the exposing, purging the precursor from the reaction chamber for a purge time;
(iii) repeating steps (i) and (ii) using the precursor not used in step (i); and removing the substrate, coated with the material, from the reaction chamber.

12. The method of example 11 further comprising controlling a concentration of a dopant in the material by:

exposing the surface to the dopant during the exposing step (i), and
controlling at least one of:
the evaporation temperature, and thus a partial pressure of the first precursor,
deposition cycle time comprising the purge time which removes the precursor but not the dopant,
a composition of the precursor,
a shape of the charge, or
dimensions of the charge relative to dimensions of the substrate.

13. The method of example 11, further comprising:

removing the substrate after venting the reaction chamber and cooling the charge, wherein the cooling is after the depositing and prior to the venting.

14. The method of example 11, wherein the evaporation temperature is below 650 degrees Celsius and a pressure in a reaction chamber is less than $10^{-2}$ Torr.

15. An apparatus 600 for depositing a material, comprising:

a thermal evaporator 602 flowing electrical current 606 generating heat used to evaporate a first source material 1001 from a charge 1002 to form a first precursor 1004 in a first gaseous phase;
a reactor 1000 comprising a reaction chamber 1006 coupled to the thermal evaporator 602, an inlet 1008 to the reaction chamber 1006, and an outlet 1009 from the reaction chamber;
a computer 1400 coupled to the thermal evaporator 602 and the reactor 1000, the computer controlling a sequential reaction of a surface 1010 of a substrate 1012 with the first precursor 1004 and a second precursor 1014 comprising a second source material, the controlling comprising:
controlling a flow rate of an inert gas 1111 through the inlet 1008, the inert gas transporting the first precursor to the surface of 1010 the substrate 1012 mounted in the reaction chamber;
adjusting a flow of the electrical current 606 to control a temperature of the charge;
after the reaction, controlling a purging of the first precursor 1004 or the second precursor 1014 from the reaction chamber through the outlet 1009; and
so as to deposit an amount of the first source material 1001 that forms the material 1020 comprising a stoichiometric combination of the first source material and the second source material.

16. The apparatus of example 15, wherein the reaction chamber 1006 comprises a base plate 1022 comprising a plurality of openings 1024, the controlling further comprising controlling a flow of the second precursor 1014 through the openings into a cross flow of the inert gas 1111 so that the inert gas transports the second precursor to the surface 1010 of substrate 1012 mounted on the base plate 1022.

17. The apparatus of example 16, wherein the openings 1024 are on an outside of the charge 1002 further from the substrate than the charge.

18. The apparatus of example 16, wherein:

the thermal evaporator 602 comprises a boat 616 containing the charge 1002 (e.g. pellets), and
the boat 616 is thermally coupled to a wire 614 conducting the electrical current 606.

19. The apparatus of example 16, wherein the thermal evaporator 602 comprises a channel 612 containing the charge 1002 and channeling flow of the first precursor 1004 vertically into a cross-flow of the inert gas 1111 and with uniform partial pressure.

20. The apparatus of example 19, wherein the channel 614 has a curvature curving around a portion of the substrate 1012.

21. The apparatus of example 15, further comprising electrical contacts positioned to pass the electrical current 606 through the charge shaped as a wire, such that the first source material 1001 evaporates into a cross-flow of the inert gas 1111 and with uniform partial pressure.

22. The apparatus of any of the examples 15-21, further comprising electrical contacts 1050 for passing the electrical current 606.

23. The method of any of the examples 1-14 performed using the apparatus of any of the examples 15-23.

Example Computer Hardware

Figure 14:
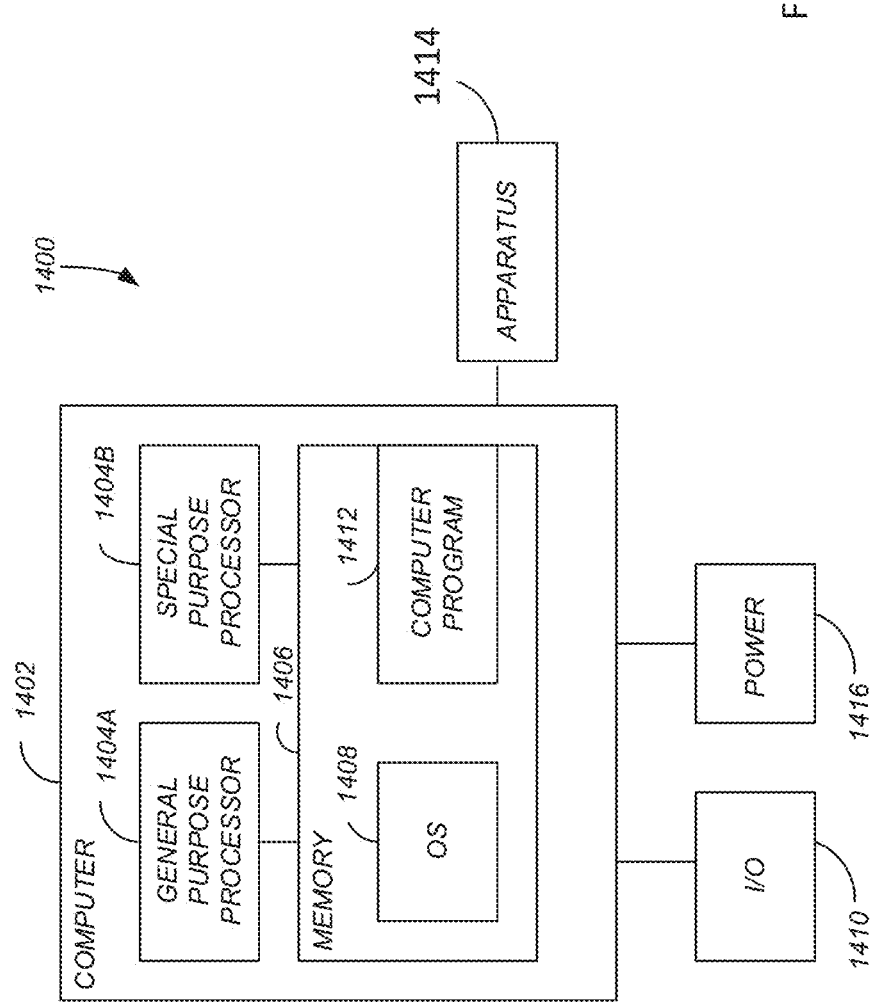
FIG. 14. Computer for controlling various methods and apparatus described herein.

FIG. 14 illustrates an exemplary system 1400 that could be used to implement processing elements needed to control the etching or TE-ALD apparatus 508, 600 (e.g., 1414) described herein.

The computer 1402 comprises a processor 1404 (general purpose processor 1404A and special purpose processor 1404B) and a memory, such as random access memory (RAM) 1406. Generally, the computer 1402 operates under control of an operating system 1408 stored in the memory 1406, and interfaces with the user/other computers to accept inputs and commands (e.g., analog or digital signals) and to present results through an input/output (I/O) module 1410. The computer program application 1412 accesses and manipulates data stored in the memory 1406 of the computer 1402. The operating system 1408 and the computer program 1412 are comprised of instructions which, when read and executed by the computer 1402, cause the computer 1402 to perform the operations herein described. In one embodiment, instructions implementing the operating system 1408 and the computer program 1410 are tangibly embodied in the memory 1406, thereby making a computer program product or article of manufacture. As such, the terms "article of manufacture," "program storage device" and "computer program product" as used herein are intended to encompass a computer program accessible from any computer readable device or media.

In one embodiment, computer 1402 comprises one or more field programmable gate arrays (FPGAs) or application specific integrated circuits (ASIC).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for etching a surface, comprising:
   (a) obtaining a structure comprising a plurality of nanowires on or above a substrate and a dielectric layer on or above the nanowires, wherein the dielectric layer comprises protrusions formed by the underlying nanowires;
   (b) reacting a surface of the dielectric layer with a reactant, comprising a gas or a plasma, to form a reactive layer on the dielectric layer, wherein the reactive layer comprises a chemical compound including the reactant and elements of the dielectric layer and the reactive layer comprises sidewalls defined by the protrusions; and
   (c) selectively etching the reactive layer, wherein the etching etches the protrusions laterally through the sidewalls so as to planarize the surface and remove or shrink the protrusions.

2. The method of claim 1, wherein the etching comprises reacting the reactive layer with an agent that induces a re-arrangement of chemical bonds between constituents of the reactive layer and wherein the re-arrangement removes the reactive layer from the surface.

3. The method of claim 2, wherein the reacting comprises projecting the agent onto the surface with an energy: below that required for physical sputtering of the surface using the agent so that material is not ejected from the substrate by a physical sputtering process, and sufficient to act as a catalyst for the re-arrangement.

4. The method of claim 2, wherein the agent comprises ions.

5. The method of claim 1, wherein the etching comprises accelerating ions onto the surface so that a majority of the ions impact the surface at an angle of at least 10 degrees with respect to a surface normal.

6. The method of claim 1, wherein the etching comprises accelerating ions onto the reactive layer along a direction having a larger component parallel to the surface of the reactive layer, as compared to the component normal to the surface.

7. The method of claim 1, wherein the etching comprises chemical sputtering.

8. The method of claim 1, wherein the reactive layer comprises valleys having sidewalls and the etching etches the valleys laterally through the sidewalls so as to planarize the surface and remove or connect the valleys.

9. The method of claim 8, wherein the valleys have a height and width in a range of 1-100 nm.

10. The method of claim 1, wherein the reactant comprises at least one of a halogen that halogenates the surface, a sulphide so as to form the reactive layer comprising a sulphide, hydrogen or a hydride so as to form the reactive layer comprising a hydride, a nitride or nitrogen so as to form the reactive layer comprising a nitride, or oxygen or an oxide so as to form the reactive layer comprising an oxide.

11. The method of claim 1, wherein the structure comprises an electrical circuitry including the nanowires, the method further comprising electrically contacting the nanowires through the dielectric layer with wires or components in different layers of a multilayer device.

12. The method of claim 1, wherein the nanowires comprise WSi.

13. The method of claim 1, wherein the substrate comprises silicon, the nanowires comprise metal, and the dielectric layer comprises silicon dioxide.

14. The method of claim 13, wherein the reactive layer comprises chlorinated silicon, the reactant comprises chlorine, and the agent comprises argon ions.

15. The method of claim 1, further comprising repeating steps (b) and (c) so as to perform a plurality of etching cycles each comprising the step (b) and the step (c), wherein:
   the cycles include a first cycle and a second cycle subsequent to the first cycle,
   the second cycle forms the reactive layer that is thinner as compared to the reactive layer formed in the first cycle, so that the etching in the second cycle etches the reactive layer with a finer resolution as compared to the etching in the first cycle.

16. An electrical circuit manufactured using the method of claim 1.

17. The method of claim 1, wherein the nanowires comprise metal wires having a diameter of 10 nanometers or less.

18. The method of claim 1, wherein:
   the nanowires each have a width in a range of 1-500 nanometers; and
   the etching forms the dielectric layer having a thickness less than 1000 nm on or above the nanowires and a surface roughness of less than 5 nanometers.

19. The method of claim 18, wherein:
   after the etching, the dielectric layer comprises protrusions formed by and aligned with the underlying nanowires, the protrusions have a height and a width less than 5 nanometers and the dielectric layer comprises valleys having laterally etched sidewalls, the method further comprising depositing or more layers including wiring on or above the dielectric layer.

20. An apparatus for etching a substrate, comprising:

one or more reactor tools reacting a reactant with a surface of a dielectric layer so as to form a reactive layer on the dielectric layer, wherein the reactant comprises a gas or plasma, wherein:

the reactive layer comprises a chemical compound including the reactant and elements of the dielectric layer and the reactive layer comprises sidewalls defined by protrusions; and the dielectric layer comprises the protrusions formed by the underlying nanowires; and one or more etching tools selectively etching the protrusions laterally through the sidewalls so as to planarize the surface and remove or shrink the protrusions.

* * * * *